United States Patent
Lee

(10) Patent No.: US 6,712,127 B2
(45) Date of Patent: Mar. 30, 2004

(54) HEATSINK AND HEATSINK DEVICE USING THE HEATSINK

(75) Inventor: Sang-cheol Lee, Kyungki-do (KR)

(73) Assignee: Zalman Tech Co., Ltd., Seoul (KR)

( * ) Notice: Subject to any disclaimer, the term of this patent is extended or adjusted under 35 U.S.C. 154(b) by 0 days.

(21) Appl. No.: 10/086,368

(22) Filed: Mar. 4, 2002

(65) Prior Publication Data

US 2002/0121358 A1 Sep. 5, 2002

(30) Foreign Application Priority Data

Mar. 3, 2001 (KR) ........................................ 2001-11056
Nov. 10, 2001 (KR) ........................................ 2001-69984
Nov. 10, 2001 (KR) ........................................ 2001-69985

(51) Int. Cl.$^7$ ................................................ H05K 7/20
(52) U.S. Cl. ....................... 165/80.3; 165/121; 165/185; 174/16.3; 257/722; 361/697
(58) Field of Search ................................ 165/80.3, 121, 165/122, 185; 174/16.3; 257/722; 361/704, 697

(56) References Cited

U.S. PATENT DOCUMENTS

| | | | | |
|---|---|---|---|---|
| 3,095,037 A | * | 6/1963 | Bohm ......................... | 165/185 |
| 4,449,164 A | * | 5/1984 | Carlson et al. ............. | 361/694 |
| 6,289,975 B2 | * | 9/2001 | Kuo ........................... | 165/80.3 |
| 6,360,816 B1 | * | 3/2002 | Wagner ...................... | 165/122 |
| 6,407,919 B1 | * | 6/2002 | Chou .......................... | 361/697 |
| 6,411,510 B2 | * | 6/2002 | Sasa et al. ................... | 361/697 |

FOREIGN PATENT DOCUMENTS

SU 1714724 A1 * 2/1992 ................. 257/722

* cited by examiner

Primary Examiner—Leonard R Leo
(74) Attorney, Agent, or Firm—Leydig, Voit & Mayer, Ltd.

(57) ABSTRACT

A heatsink and a heatsink device using the heatsink are provided. The heatsink is formed of a plurality of thin heatsink plates, and the individual heatsink plates are bound to one another to be radially spread out, thereby enlarging the surface area of the heatsink and increasing its heat-dissipating efficiency. In the heatsink device, the heatsink is installed in an air duct, and cool air is supplied into the air duct by a fan, to thereby further increase the heat-dissipating efficiency. The binding force of the heatsink to a heat-generating source can be elastically maintained, which allows the heatsink to remain bound to the heat-generating source even after an external impact. In addition, by cutting out an upper portion of the heatsink plate, folding lines of the heatsink plate are shortened so that the heat-absorbing portions of the heatsink plates stacked upon one another can be tightly joined to form a heatsink by a reduced force. The resulting heatsink has a recession at the center of its upper surface. This structure allows cool air propelled by the fan to reach the bottom center of the heatsink, thereby further enhancing the heat-dissipating efficiency. Also, vibration and noise caused while cool air flows over the heat-dissipating portions of the heatsink are reduced.

12 Claims, 19 Drawing Sheets

HEATSINK AND HEATSINK DEVICE USING THE HEATSINK

BACKGROUND OF THE INVENTION

1. Field of the Invention

The present invention relates to a heatsink and a heatsink device using the heatsink, and more particularly, to a heatsink having a very large heat dissipating surface area, which is formed of a plurality of thin heatsink plates, and a heatsink device in which the heatsink is installed in an air duct, so that air generated by a fan is guided into the air duct to increase heat dissipating efficiency, and the force with which the heatsink is pressed against a heat-generating source can be elastically maintained.

2. Description of the Related Art

Heatsinks serve as cooling device for heat generating objects such as electronic components or devices, by absorbing heat generated by such objects and dissipating the absorbed heat into the air. Electronic components such as central processing units (CPUs), thermoelectric elements, video graphics array (VGA) cards, and power transistors generate a large amount of heat during operation. When the temperature of an electronic component exceeds a certain level, the electronic component may malfunction or outright fail in the worst case. For this reason, a heatsink is often required to be installed at a heat generating source to dissipate heat into air.

With the rapid development of science and technology, a variety of electronic components or devices have been highly integrated and miniaturized in recent years. As a consequence, techniques for increasing the surface area of heat dissipating fins as much as possible and shortening the heat conducting pathway in heatsinks have been suggested. By these techniques, the dimensions of heatsinks can be reduced with increased heat dissipating efficiency. However, in a conventional manufacturing process, the heat dissipating fins of a conventional heatsink cannot be made thin enough to increase the heat dissipating efficiency. In addition, the cost of manufacturing by conventional methods is high.

Heatsinks are commonly installed along with a fan to increase the heat dissipating efficiency. For example, a fan is installed on a heatsink, and blows air over the heatsink, thereby by cooling the heatsink. Although cool air is blown at the heatsink by a fan, most of it is deflected away, so a very small amount of the cool air is used for cooling. In consideration of the increasing need for high-performance and highly integrated electronic components, which generate a large amount of heat during operation, there is a need for an effective cooling mechanism capable of sufficiently dissipating the heat generated from such electronic components.

SUMMARY OF THE INVENTION

To address the above limitations, it is an object of the present invention to provide a heatsink with increased heat dissipating efficiency, in which a plurality of thin heatsink plates, which are arranged in a stack, are tightly joined to one another such that they are radially spread out, so that the heat conducting pathway becomes short with increased heat dissipating surface area.

It is another object of the present invention to provide a heatsink device using the heatsink, in which the heatsink is installed in an air duct and air from a fan is guided into the air duct to further increase the heat dissipating efficiency.

It is still another object of the present invention to provide a heatsink device in which the binding force between the heatsink and a heat-generating source can be elastically adjusted, so that the heatsink flatly contacts the entire surface of the heat-generating source, and the heatsink remains bound to the heat-generating source even after an external impact.

To achieve the objects of the present invention, there is provided a heatsink for absorbing heat generated from a heat-generating source, the heatsink being in contact with the heat-generating source, and dissipating the absorbed heat into the air, the heatsink comprising: a plurality of sheet-shaped heatsink plates each having a heat-absorbing portion in contact with the upper surface of the heat-generating source and substantially normal thereto to absorb heat from the heat-generating source, and a heat-dissipating portion extending from the heat-absorbing portion to dissipate the absorbed heat into the air, wherein the plurality of heatsink plates are arranged in a stack, the heat-absorbing portions of the individual heatsink plates are tightly joined to one another, so that the heat-absorbing portions form the center of the stack of the heatsink and the heat-dissipating portions of the individual heatsink plates are radially spread out from the center to give the heatsink an elliptical column form.

In one embodiment, the present invention provides a heatsink comprising: a plurality of sheet-shaped heatsink plates each having a heat-absorbing portion in contact with the upper surface of a heat-generating source and substantially normal thereto to absorb heat from the heat-generating source, and a heat-dissipating portion extending from the heat-absorbing portion to dissipate the absorbed heat into the air, the upper portion of each of the heatsink plates being cut out into a predetermined shape such that the resulting upper contour slants downward from the heat-dissipating portion toward the heat-absorbing portion, wherein the plurality of heatsink plates are arranged in a stack, the heat-absorbing portions of the individual heatsink plates are tightly joined to one another by a pair of compression blocks, so that the heat-absorbing portions form the center of the heatsink and the heat-dissipating portions of the individual heatsink plates are radially spread out from the center to give the heatsink an elliptical column form having a recessed upper center.

To achieve the objects described above, the present invention also provides a heatsink device comprising: a heatsink including a plurality of sheet-shaped heatsink plates each having a heat-absorbing portion in contact with the upper surface of the heat-generating source and normal thereto to absorb heat from the heat-generating source, and a heat-dissipating portion extending from the heat-absorbing portion to dissipate the absorbed heat into the air, wherein the plurality of heatsink plates are arranged in a stack, the heat-absorbing portions of the individual heatsink plates are tightly joined to one another, so that the heat-absorbing portions form the center of the heatsink and the heat-dissipating portions of the individual heatsink plates are radially spread out from the center to give the heatsink an elliptical column form; an air duct in which the heatsink is installed to guide cool air over the heatsink, the air duct having a height smaller than the heatsink to allow a predetermined gap between the lower end of the air duct and a printed circuit board; and a fan installed on the air duct for forcibly cooling the heatsink by blowing air into the air duct.

Alternatively, the heatsink device according to the present invention comprises: a mount casing coupled onto a socket frame which surrounds a heat-generating source mounted on a printed circuit board and has coupling supports protruding from its circumference, the mount casing having a coupling leg detachably coupled to each of the coupling supports of the socket frame and an air duct at its center to allow the flow of cool air therein; a heatsink installed in the air duct in contact with the upper surface of the heat-generating source to dissipate heat from the heat-generating source; an elastic compression member which elastically pushes the heatsink toward the heat-generating source while being supported by the mount casing; and a fan mounted on the mount casing to blow the cool air into the air duct.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

A heatsink according to the present invention is formed by stacking a plurality of thin heatsink plates, and tightly joining the same to one another such that they are radially spread out to increase the surface area of the heatsink. As a result, the heat conducting pathway of the heatsink becomes short with increased heat dissipating surface area, thereby increasing heat dissipating efficiency. A heatsink device according to the present invention comprises an air duct in which the heatsink is installed so that cool air generated by a fan can be guided over the heatsink, thereby further increasing the heat dissipating efficiency. In addition, by elastically supporting the heatsink with respect to a heat-generating source, so that the heatsink can remain bound to the heat-generating source even after an external impact.

Figure 1:
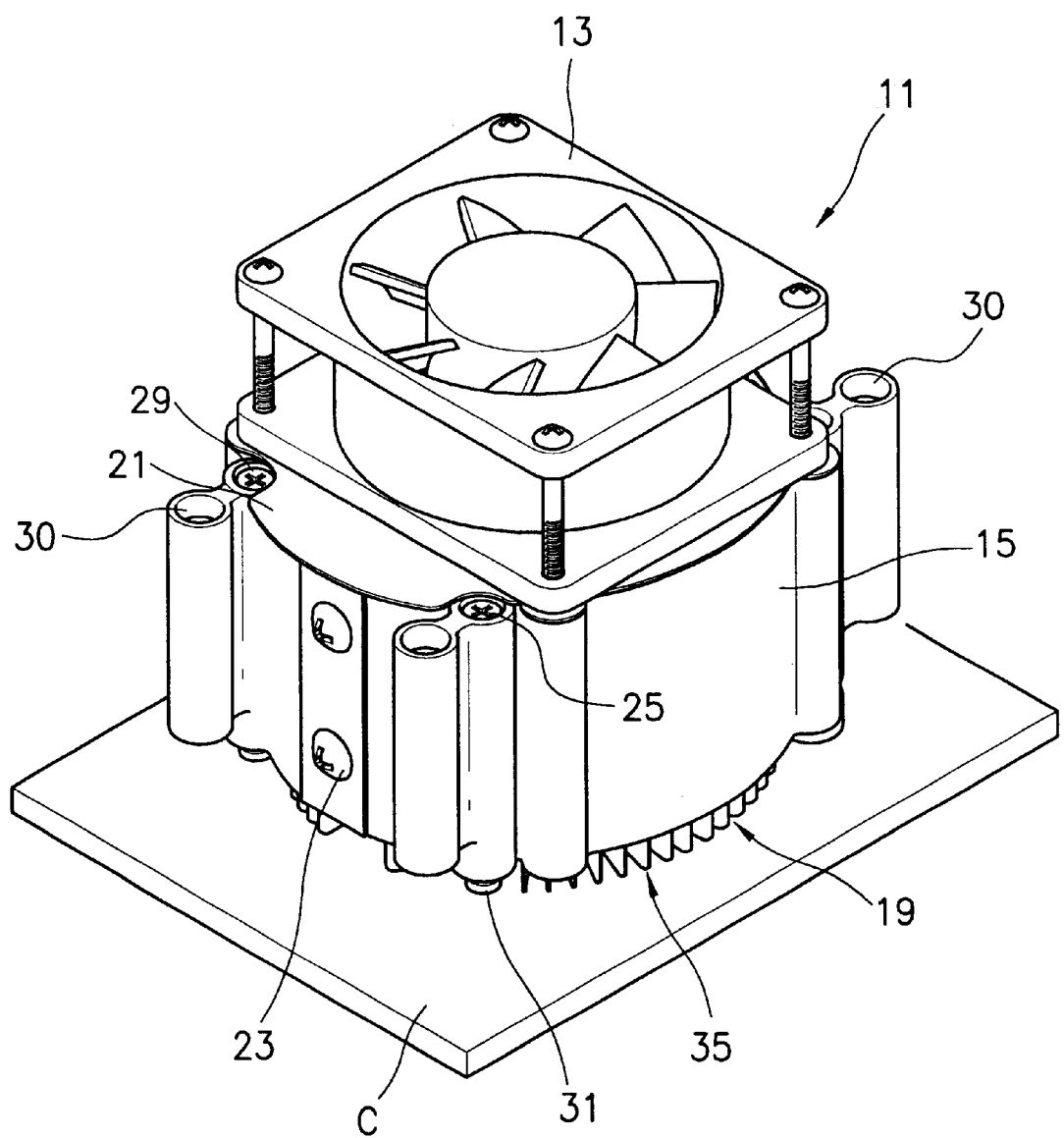
FIG. 1 is a perspective view of a first preferred embodiment of a heatsink device according to the present invention, which is mounted on a printed circuit board (PCB)

FIG. 1 is a perspective view of a preferred embodiment of the heatsink device according to the present invention, which is mounted on a printed circuit board (PCB). As shown in FIG. 1, the heatsink device 11 dissipates heat generated by an electronic component, such as a central processing unit (CPU), in a state where the heatsink device 11 is supported with respect to a PCB "C" on which the heat generating electronic component is mounted.

The heatsink device 11 includes a heatsink 35 in an elliptical column form, which is to be placed in contact with the top of an electronic component "H" (also referred to as a heat-generating source) being normal thereto (see FIG. 2), an air duct 15 in which the heatsink 35 is installed, and a fan 13 installed atop the air duct 15.

Figure 2:
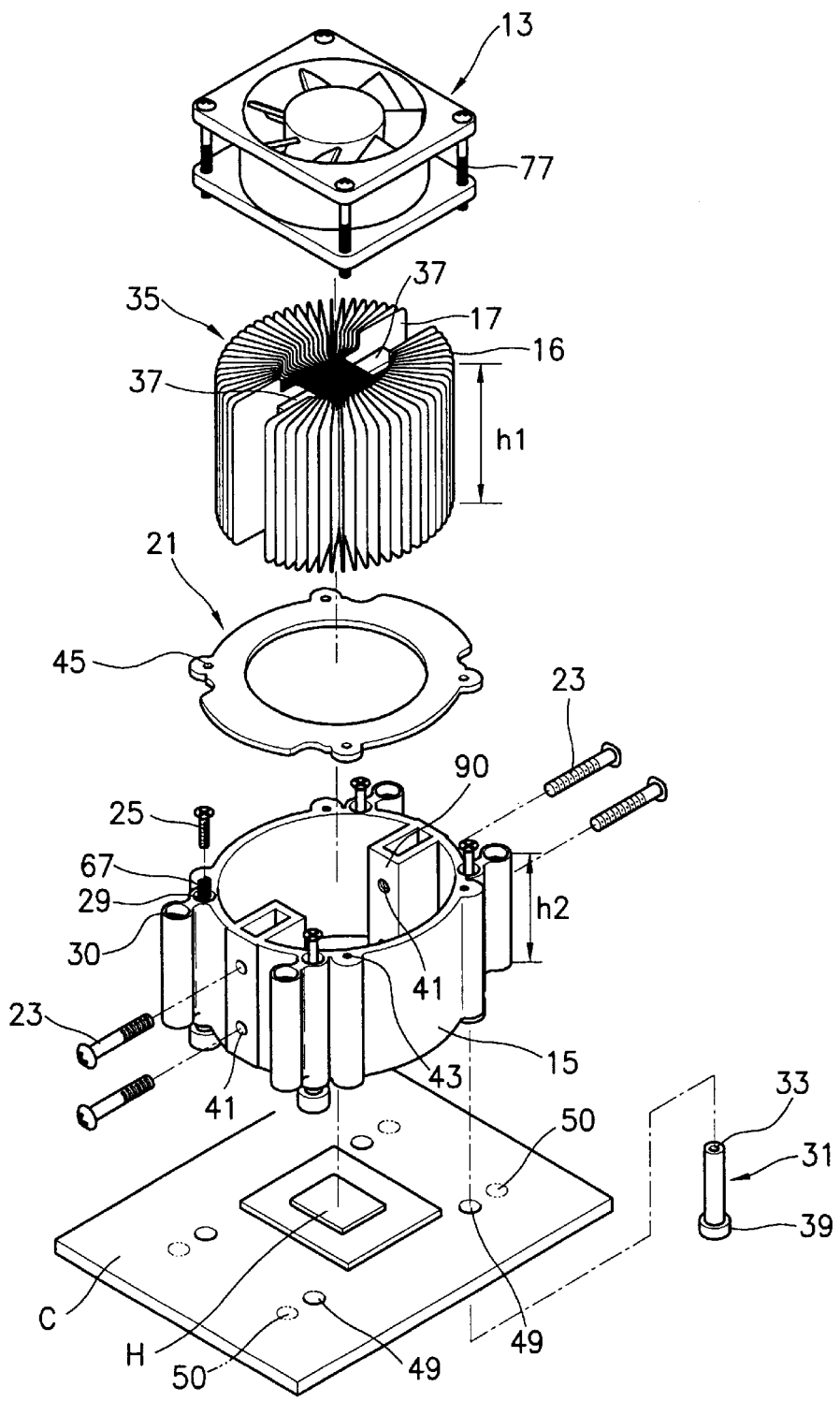
FIG. 2 is an exploded view showing the structure of the heatsink device of FIG. 1.

An auxiliary duct 21 may be interleaved between the air duct 15 and the fan 13 as needed. The auxiliary duct 21 seals the gap between the circumference of the air duct 15 and the housing of the fan 13 to guide cool air from the fan 13 into the air duct 15 without air leaking. In the present embodiment, the auxiliary duct 21 is formed like a gasket, as shown in FIG. 2.

The height h1 (see FIG. 2) of the heatsink 35 is greater than the height h2 (see FIG. 2) of the air duct 15. As a result, when the fan 13 is fixed to the top of the air duct 15, and the heatsink 35 is installed in the air duct 15, a lower portion of the heatsink 35 protrudes outward with respect to the air duct 15 by a height difference h1−h2. That is, the lower portion of the air duct 15 is spaced apart from the PCB "C" by the height difference h1−h2.

The gap between the air duct 15 and the PCB "C" serves as an air pathway 19 to allow air to flow into and out of the air duct 15 when the fan 13 is operated. For example, if the fan 13 is operated such that air is sucked up from the air duct 15, air enters the air duct 15 through the air pathway 19. If the fan 13 is operated such that air is forced into the air duct, air from the fan 13 passes through the heatsink 35 and exits the air duct 15 through the air pathway 19.

Eight vertical through holes 29 and 30 are formed in pairs on the outer circumference of the air duct 15. An elastic coupler, which applies an elastic force to the PCB "C" and allows the air duct 15 to remain on and normal to the PCB "C" by the elastic force, is installed at each vertical through hole 29 or 30.

The elastic coupler applies a predetermined elastic force to the PCB "C" to ensure tight contact between the heatsink 35 and the heat-generating source "H". The elastic coupler keeps the heatsink 35 in tight contact with the entire surface of the heat-generating source "H" being normal thereto, and holds the heat-generating source "H" in place even after a strong impact is applied. This elastic coupler will be described later with reference to FIGS. 8A and 8B.

FIG. 2 is an exploded view showing the structure of the heatsink device of FIG. 1. Referring to FIG. 2, the heatsink device 11 includes the heatsink 35 having an elliptical column form, which is to be mounted on the heat-generating source "H", the air duct 15 which is elastically supported with respect to the PCB "C" being normal thereto and in which the heatsink 35 is installed, the auxiliary duct 21 installed on the air conduct 15, and a fan 13 fixed to the top of the auxiliary duct 21.

The heatsink 35 having an elliptical column form is manufactured by tightly joining the heat-absorbing portions 73 (see FIG. 3) of a plurality of heatsink plates 16 and 17, which are arranged in a stack, such that the heat-dissipating portions 75 (see FIG. 3) are radially spread out. The heat-absorbing portions 73 of the individual heatsink plates form the center of the heatsink, and the heat-dissipating portions 75 extends outward from the heat-absorbing portions 73, to give the heatsink an elliptical column form. The bottom of the heatsink 35 is brought in contact with the upper surface of the heat-generating source "H" being normal thereto, so that heat generated by the heat-generating source "H" is transferred to the surface of the individual heatsink plates 16 and 17 in the upward and radial directions.

Figure 3:
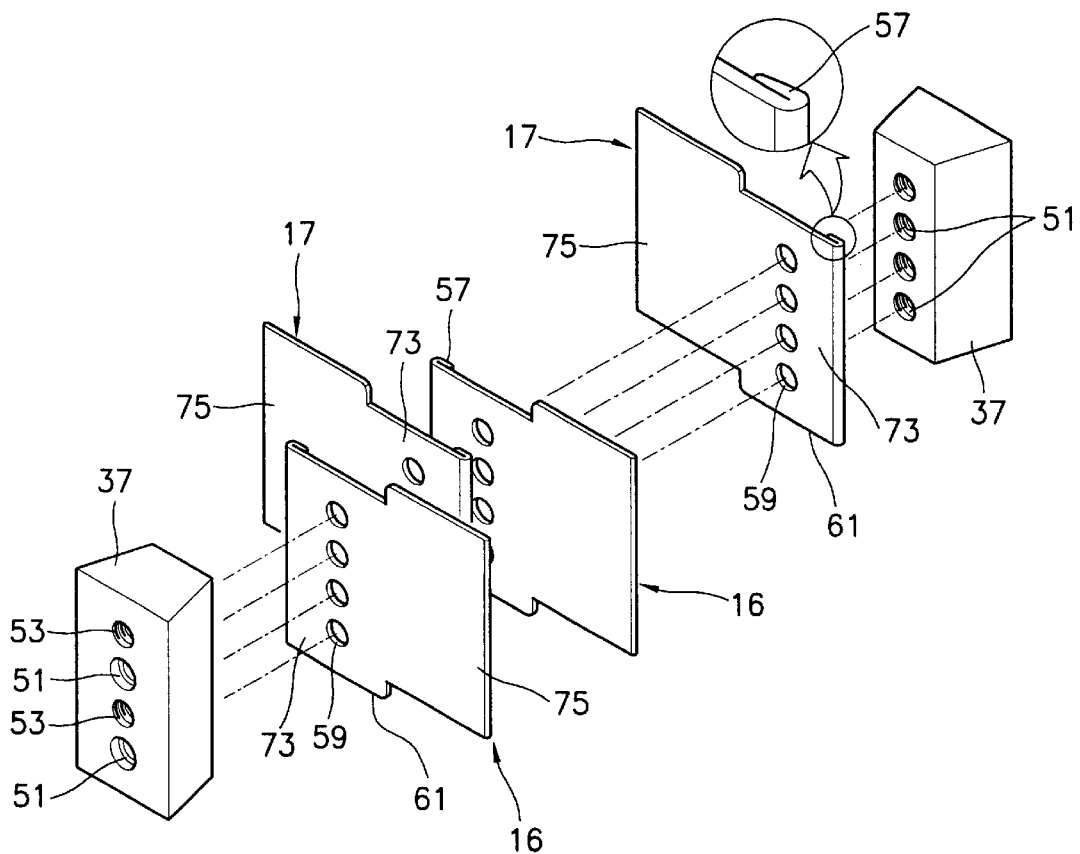
FIG. 3 is an exploded view of an example of a heatsink applicable to the heatsink device of FIG. 1, in which only a few heatsink plates are shown.

Reference numeral 37 denotes a compression block. As shown in FIG. 3, the compression block 37 is formed as a trapezoidal column. The two compression blocks 37 are placed close to the heat-absorbing portions 73 (see FIG. 3) of the stack of heatsink plates 16 and 17, and pushed inward to tightly join the heat-absorbing portions 73 to one another. The compression blocks 39 may be formed as rectangular columns, rather than trapezoidal columns, in terms of productivity. In this case, a compression force stronger than for the trapezoidal compression blocks is required to spread out the heat-dissipating portions 75. The structure of the heatsink 35, and a method for manufacturing the heatsink 35 will be described in greater detail later with reference to FIGS. 3 through 7.

A pair of heatsink-clamping columns 90 protrude from the inner circumference of the air duct 15 facing each other, and two holes 41 are formed in each of the heatsink-clamping columns 90 in a longitudinal direction. Four clamping screws 23 are inserted into the air duct 15 in a lateral direction through the holes 41 and screwed into respective screw holes 53 (see FIG. 5A) of the compression block 37 of the heatsink 35. As each of the clamping screws 23 is screwed into the corresponding screw hole 53 through the corresponding hole 41, the heatsink 35 is tightly fixed to the air duct 15.

Figure 9:
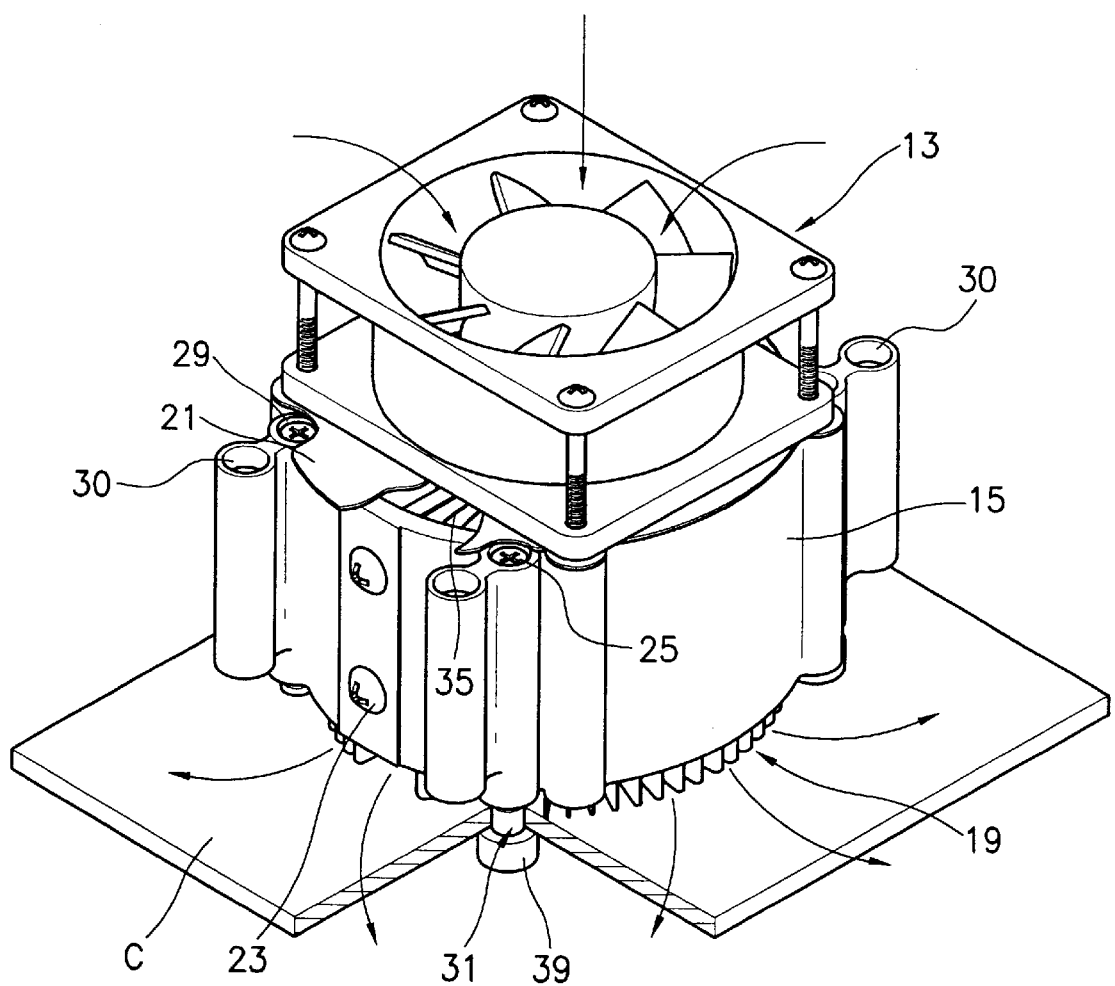
FIG. 9 is a partially cutaway perspective view illustrating the operation of the heatsink device of FIG. 1, and a method of mounting the heatsink device on a PCB.

The auxiliary duct 21 seated on the air duct 15 seals the gap between the fan 13 and the circumference of the air duct 15 to prevent leakage of air propelled by the fan 13, as shown in FIG. 9. Alternatively, the auxiliary duct 21 and the air duct 15 can be formed as a single unit. For example, when a plastic injection technique is applied to form the air duct 15, it is preferable that the auxiliary duct and the air duct 15 are formed as a single unit.

The auxiliary duct 21 is formed as a flat member having a circular hole at its center, and the rim of the auxiliary duct 21, which is conformal to the top contour of the air duct 15, has four screw holes 45. The central circular hole of the auxiliary duct 21 corresponds to an air pathway of the fan 13.

Four screw holes 43 are formed at the top surface of the air duct 15. Four screws 77 are screwed into the screw holes 43 through the edge of the fan 13 and corresponding screw holes 45 of the auxiliary duct 21, so that the fan 13 is fastened to the air duct 15.

Figure 8A:
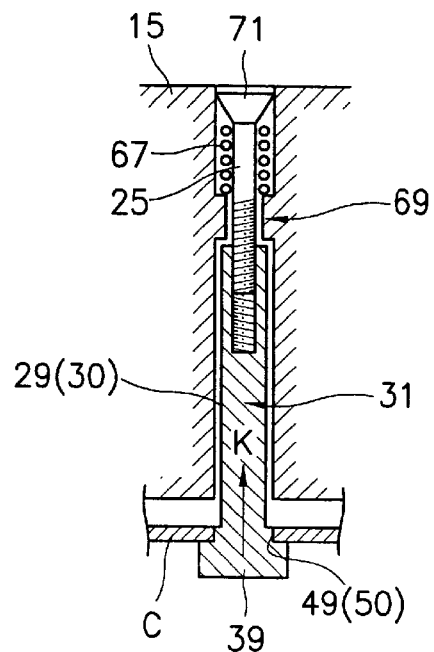
FIG. 8A is a sectional view of an example of an elastic coupler of the heatsink device of FIG. 1, which elastically couples the heatsink device to a PCB.

The vertical through holes 29 and 30 are formed in pairs at four locations on the outer circumference of the air duct 15. A hold down screw 25, a spring 67 which is slid over the hold down screw 25, and a coupling rod 31 coupled to the hold down screw 25, are inserted into each vertical through hole 29 or 30. As shown in FIG. 8A, a support projection 69 is formed on the inner wall of each of the vertical through holes 29 and 30. The ends of the coupling rod 31 and the hold down screw 25 are coupled within each vertical through hole 29 or 30. The spring 67 elastically supports the hold down screw 25 upward against the support projection 69 (see FIG. 8A).

The coupling rod 31 having a cylindrical form has a screw hole 33 at one end, and a support head 39 at the other end. The coupling rod 31 is inserted into each assembly hole 49 or 50 of the PCB "C", from the bottom to the top of the PCB "C", and pushed upward. At this time, the support head 39 of the coupling rod 31 remains at the bottom of the PCB "C" and supports the PCB "C" upward. As the hold down screw 25 is screwed into the screw hole 33 of the coupling rod 31, the air duct 15 is elastically bound to the PCB "C" by an elastic force of the spring 67.

Although a pair of the vertical through holes 29 and 30 are formed at four locations around the air duct 15 in the illustrated embodiment, it will be appreciated that more vertical through holes can be formed around the air duct 15. The vertical through holes 29 and 30 of the air duct 15 are positioned corresponding to the assembly holes 49 and 50 formed in the PCB "C", respectively. The inner assembly holes 49 correspond to the assembly holes formed in a PC motherboard comprising the Via KT133 chip set for AMD CPU's. The outer assembly holes 50 correspond to the assembly holes formed in, for example, motherboards made for Intel's Pentium 4 CPU. The vertical through holes 29, which are closer to the air duct 15 than the vertical through holes 30 are, match the inner assembly holes 49, and the vertical through holes 30 match the outer assembly holes 50. Thus, the heatsink device according to the present invention can be applied to both types of motherboards. Furthermore, the heatsink device according to the present invention can be applied to any PCB, whose size and specifications differ from the two boards described previously, by varying the shape of the circumference of the air duct 15.

FIG. 3 is an exploded view of an example of a heatsink applicable to the heatsink device of FIG. 1, in which a few heatsink plates are shown. Referring to FIG. 3, the heatsink includes a plurality of heatsink plates 16 and 17, and two compression blocks 37 for tightly joining the plurality of heatsink plates 16 and 17 to one another. The individual heatsink plates 16 and 17 are heat-dissipating fins made of thin sheet-metal. The heatsink plates 16 and 17, and heatsink plates 154 and 180 (see FIGS. 12 and 16), which are described later with respect to a second embodiment of the present invention, can be formed of a known metal having good thermal conductivity, such as copper (Cu), aluminum (Al) or an Al alloy. The heatsink plates 16, 17, 154, and 180 may be formed of silver (Ag) as needed.

Figure 5A:
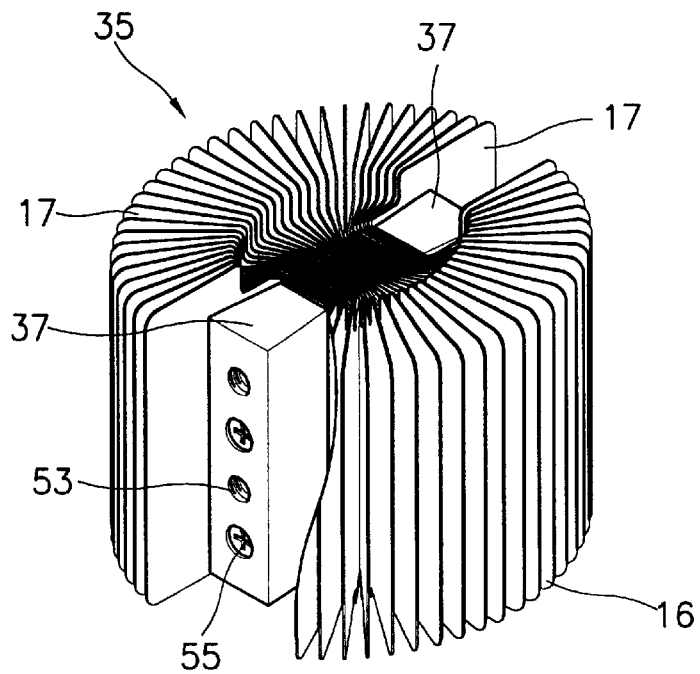
FIG. 5A is a partially cutaway perspective view of a complete heatsink, which is assembled as illustrated in FIG. 3.
Figure 5B:
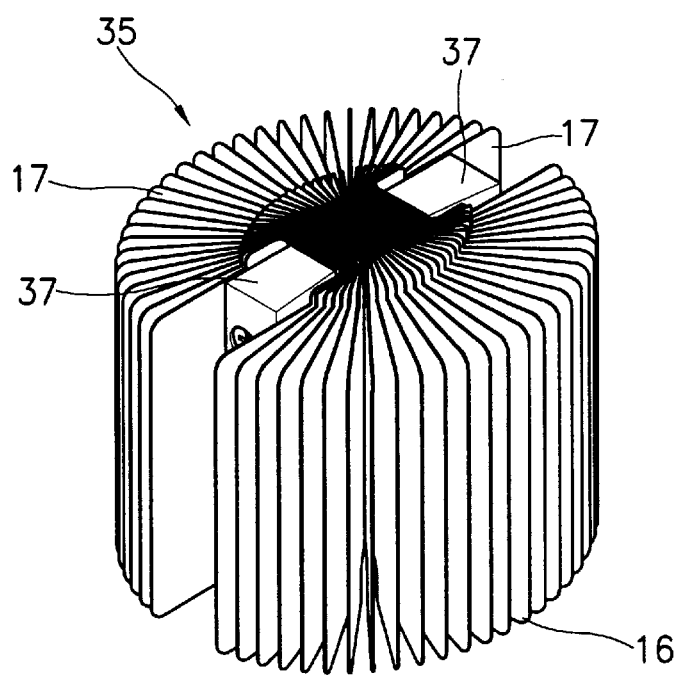
FIG. 5B is an inverted perspective view of the heatsink of FIG. 5A.

Each of the heatsink plates 16 and 17 includes a heat-absorbing portion 73, and a heat-dissipating portion 75 extending from the heat-absorbing portion 73. Four holes 59 are formed in the heat-absorbing portion 73 in a longitudinal direction. Two of the four holes 59 are for coupling with the air duct 15, as described with reference to FIG. 2. Thus, if only the heatsink 35 without the air duct 15 is installed on a heat-generating source, just two holes 59 can be formed in each of the heat-absorbing portions 73 in a longitudinal direction. The lower edges of the heat-absorbing portions 73, which form a contact surface 61 with the top of the heat-generating source "H", are flat to ensure tight contact with the entire top of the heat-generating source 47, as shown in FIG. 5B.

To the two neighboring heatsink plates 16 and 17, as shown in FIG. 3, the heat-dissipating portion 75 of the heatsink plate 16 extends from the heat-absorbing portion 73 on the right, whereas the heat-dissipating portion 75 of the heatsink plate 17 extends on the left. Thus, as the plurality of the heatsink plates 16 and 17 are alternately stacked, the heat-dissipating portions 75 of the heatsink plates 16 and 17 extend in a staggered fashion, i.e., alternately on the right and left.

The side edge of the heat-absorbing portion 73 of each of the heatsink plates 16 and 17 is folded by a predetermined width to form a folded portion 57. The folded portion 57, which has a predetermined thickness, provides a space between neighboring heatsink plates 16 and 17. As a compression force is applied to the heat-absorbing portions 73 of the stack of heatsink plates 16 and 17, each having the folded portion 57, by the compression blocks 37 in contact with the heat-absorbing portions 73 of the outermost heatsink plates 16 and 17, the heat-dissipating portions 75 of the individual heatsink plates 16 and 17 are radially spread out by a force exerted upon the folded portions 57, resulting in a cylindrical heatsink 35, as shown in FIGS. 5A and 5B.

The heat-dissipating portions 75 of the individual heatsink plates 16 and 17 are spread out a predetermined distance from each other. The heat-dissipating portions 75 are spread out by a distance related to the thickness of the folded portions 57 as the heat-absorbing portions 73 of the stack of individual heatsink plates 16 and 17 are tightened by the compression force. Although the heat-absorbing portion 73 is folded once in the illustrated embodiment, it will be appreciated that the heat-absorbing portion 73 may be folded two or three times.

The compression blocks 37 compress the stack of heatsink plates 16 and 17 in contact with the heat-absorbing portions 73 of the outermost heatsink plates 16 and 17. Each of the compression blocks 37 has two screw holes 53 into which the clamping screws 23 (see FIG. 2) are screwed, and two through holes 51, which communicate with two holes 59 of the heatsink plates 16 and 17 and are used to combine the compression blocks 37 with the heatsink plates 16 and 17.

To tighten the individual heatsink plates 16 and 17 arranged in a stack with the compression blocks 37, bolts or rivets can be used. After inserting bolts (not shown) through the through holes 51 of a compression block 37 and the holes 59 of the heatsink plates 16 and 17, the bolts protruding out from the through holes 51 of the other compression block 37 are screwed into nuts (not shown), so that the individual heatsink plates 16 and 17 are combined with the compression blocks 37. Alternatively, after inserting common rivets (not shown) through the through holes 51 of a compression block 37 and the holes 59 of the heatsink plates 16 and 17, the ends of the rivets projecting out from the through holes 51 of the other compression block 37 are hit to form rivet heads, thereby resulting in a complete heatsink.

Figure 4:
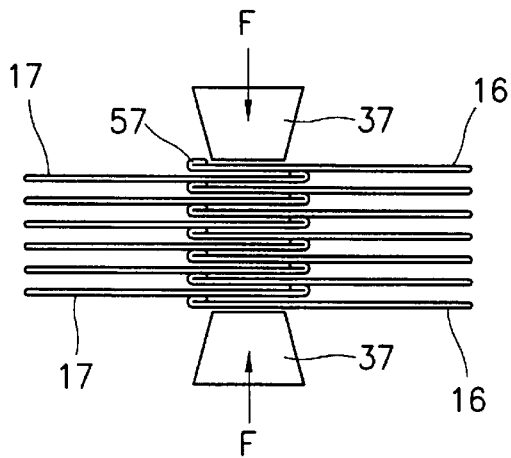
FIG. 4 is a plan view showing a state where the heatsink plates are stacked and compression blocks are brought in contact with the stack.

FIG. 4 is a plan view showing a state where the heatsink plates 16 and 17 are stacked, as illustrated in FIG. 3, and the compression blocks 37 are brought in contact with the stack. Referring to FIG. 4, each of the heatsink plates 16 and 17 has the folded portion 57, and the individual heatsink plates 16 and 17 are spaced apart a distance related to the thickness of the folded portion 57. As the compression blocks 37 in contact with the outermost heatsink plates 16 and 17 are pushed in direction F, the heat-dissipating portions 75 of the heatsink plates 16 and 17 are spread out to form a complete heatsink, as illustrated in FIGS. 5A and 5B.

FIG. 5A is a partially cutaway perspective view of a complete heatsink, which is assembled as illustrated in FIGS. 3 and 4, and FIG. 5B is an inverted perspective view of the heatsink of FIG. 5A. As shown in FIGS. 5A and 5B, the heat-absorbing portions of the heatsink plates 16 and 17 are compressed and bound to one another by the compression blocks 37. The compression blocks 37 are pushed by as strong a force as possible such that the compression blocks 37 become closer to each other, and fixed to the heat-absorbing portions 73 of the heatsink plates 16 and 17, so that the heat-dissipating portions 75 of the individual heatsink plates 16 and 17 are radially spread out.

Reference numeral 55 denotes a bolt serving as a binding means of the compression blocks 37. Although the bolt 55 is used as a binding means in the illustrated embodiment, it will be appreciated that a known rivet or other binding means can be used instead of the bolt 55 to bind the compression blocks 37 to the heatsink plates 16 and 17. Although the compression blocks 37 have an indentation (not shown) around each of the through holes 51 in the illustrated embodiment to receive the heads of the bolts 55, as shown in FIG. 5A, the compression blocks 37 may be designed so that the heads of the binding means protrude outward to simplify the manufacturing process.

As shown in FIG. 5B, the heat-absorbing portion of the heatsink 35 at the bottom is made flat to ensure tight contact with the entire surface of the heat-generating source "H".

Figure 6:
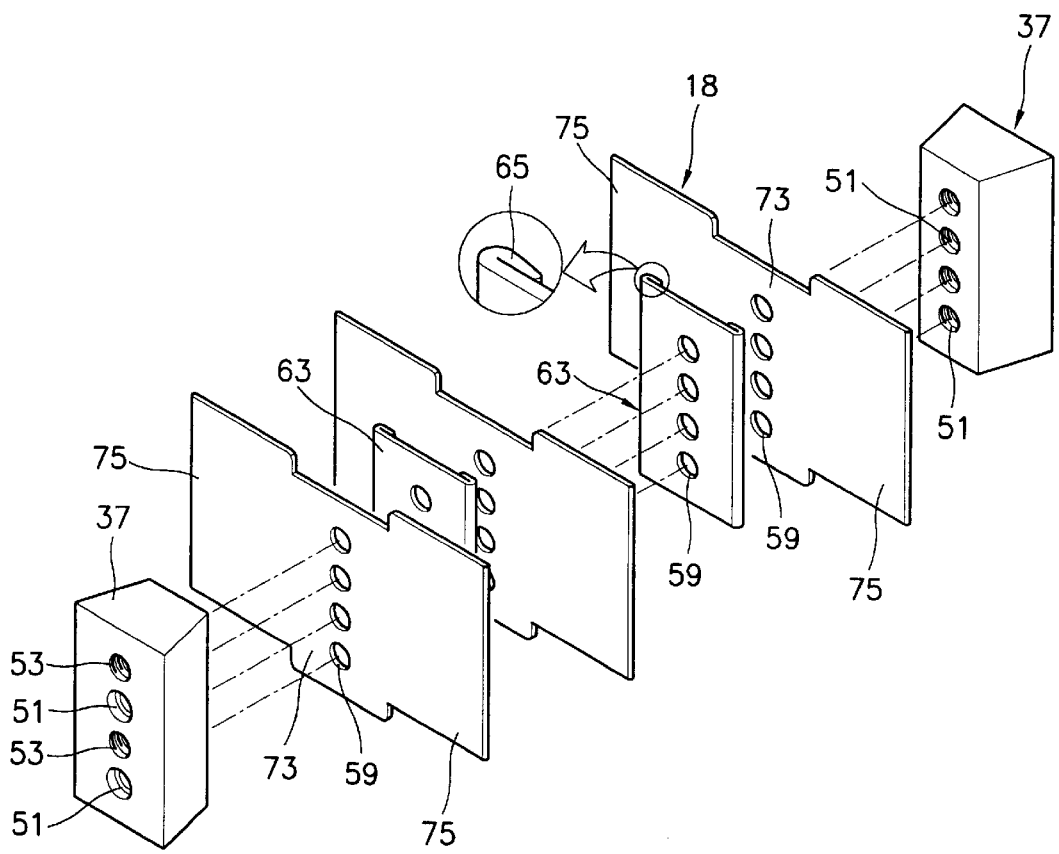
FIG. 6 is an exploded view of another example of the heatsink applicable to the heatsink device of FIG. 1, in which only a few heatsink plates are shown.

FIG. 6 is an exploded view of another example of the heatsink applicable to the heatsink device of FIG. 1, in which only a few heatsink plates are shown. Elements having the same function as in FIG. 3 are denoted by the same reference numerals. Referring to FIG. 6, the heatsink includes a plurality of stacked heatsink plates 18, a plurality of spacers 63, each of which is interposed between neighboring heatsink plates 18, and a pair of compression blocks 37 for tightly joining the heatsink plates 18 to one another.

The heatsink plates 18 are formed of thin sheet-metal. The same material used to form the heatsink plates 16 and 17 of FIG. 3 can be selected to form the heatsink plates 18. Each of the heatsink plates 18 has a heat-absorbing portion 73 at the center, and a pair of heat-dissipating portions 75 which symmetrically extend from the heat-absorbing portion 73. The heat-absorbing portion 73 and the corresponding pair of heat-dissipating portions 75 are formed as a single body. Four holes 59 are formed in the heat-absorbing portion 73 in a longitudinal direction. Two of the four holes 59 are for coupling with the air duct 15, as in the previous embodiment described with reference to FIG. 3.

The spacers 63 are formed of thin sheet-metal, and the size of a single spacer corresponds to the size of the heat-absorbing portion 73. Both side edges of each of the spacers 63 are folded to form folded portions 65. The folded portions 65 are parallel to each other. The role of the folded portions 65 is the same as the role of the folded portions 57 of FIG. 3. As the compression blocks 37 are pushed such that the compression blocks 37 become closer to each other in a state where the stack of heatsink plates 18 and spacers 63 is placed therebetween, a force exerted upon the folded portions 57 is transferred to the heat-dissipating portions 75 of neighboring heatsink plates 18, so that the heat-dissipating portions 75 of the individual heatsink plates 18 are radially spread out, as shown in FIGS. 5A and 5B.

Figure 7:
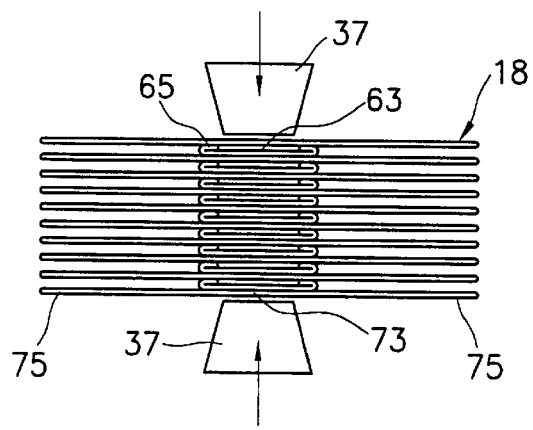
FIG. 7 is a plan view showing a state where the heatsink plates and spacers are alternately stacked to one upon the other, as illustrated in FIG. 6, and compression blocks are brought into contact with the stack.

FIG. 7 is a plan view showing a state where the heatsink plates 18 and the spacers 63 are alternately stacked upon one another, as illustrated in FIG. 6, before compression by the compression blocks 37 to form a complete heatsink. Referring to FIG. 7, the individual heatsink plates 18 are spaced apart a predetermined distance from each other by the spacers 63. Since each of the spacers 63 is folded once, the distance between neighboring heatsink plates 18 is twice the thickness of a single spacer 63. The spacers 73 may be folded more than once.

As the compression blocks 37 are brought in contact with the heat-absorbing portions 73 of the outermost heatsink plates 18, and are pushed into the stack of heatsink plates 18 and spacers 63, the heat-dissipating portions 75 extending from the heat-absorbing portions 73 radially spread out by a force exerted upon the folded portions 65.

FIG. 8A is a sectional view of an example of an elastic coupler of the heatsink device of FIG. 1, which elastically couples the heatsink device to a PCB. As previously described, the air duct 15 of the heatsink device according to a preferred embodiment of the present invention is electrically supported with respect to the PCB "C" by an elastic coupler. Accordingly, although the air duct 15 is moved upward by a strong impact, the air duct 15 immediately returns to its initial position on the PCB "C" (see FIG. 1) and thus the heatsink 35 therein is kept in contact with and normal to the entire surface of the heat-generating source.

Referring to FIG. 8A, a support projection 69 is formed on the inner wall of each of the vertical through holes 29 and 30, which are formed around the air duct 15. The support projection 69 supports the spring 67 upward in each of the vertical through holes 29 or 30. A coupling rod 31, a hold down screw 25, and a spring 67, which supports the hold down screw 25 upward, are inserted into each of the vertical through holes 29 or 30. A vertical movement of the heatsink device is guided along the vertical through holes 29 and 30 by the coupling rods 31 which contact the inner wall of the vertical through holes 29 or 30.

The coupling rod 31 has a support head 39 and a screw hole 33 at its ends. The coupling rod 31 is inserted into each of the vertical through holes 29 or 30 through the corresponding assembly holes 49 or 50 of the PCB "C", from the bottom to the top of the PCB "C". The PCB "C" is supported by the support head 39 which remains at the bottom of the PCB "C".

The hold down screw 25 is inserted downward into each of the vertical through holes 29 or 30 to screw into the screw hole 33 of the corresponding coupling rod 31. At this time, the spring 67 is slid over the hold down screw 25, and then the hold down screw 25 is inserted into the vertical through hole 29 or 30, so that the head 71 of the holding down screw 25 is supported by the spring 67 against the support projection 69, as shown in FIG. 8A. As the hold down screw 25 is inserted further into the coupling rod 31, the spring 67 is well compressed, increasing an upward support force with respect to the PCB "C" by the support head 39. Because the support head 39 of the coupling rod 31 remains at the bottom of the PCB "C", the support force of the support head 39, which is exerted in direction K, becomes stronger as the hold down screw 25 is tightened more and more.

The support force of the support head 39 with respect to the PCB "C" can be controlled by adjusting the degree to which the hold down screw 25 is tightened. The support force afforded by the support heads 39 is equal to the binding force of the heatsink 35 to the heat-generating source "H". Thus, the binding force between the heatsink 35 and the heat-generating source "H" can be adjusted by varying the degree to which the hold down screws 25 are tightened.

The support force is retained as the elastic force of the springs 67. As a result, even if an external impact is applied to the PCB "C", the impact is absorbed by the springs 67 and thus not transferred to the heat-generating source "H".

Figure 8B:
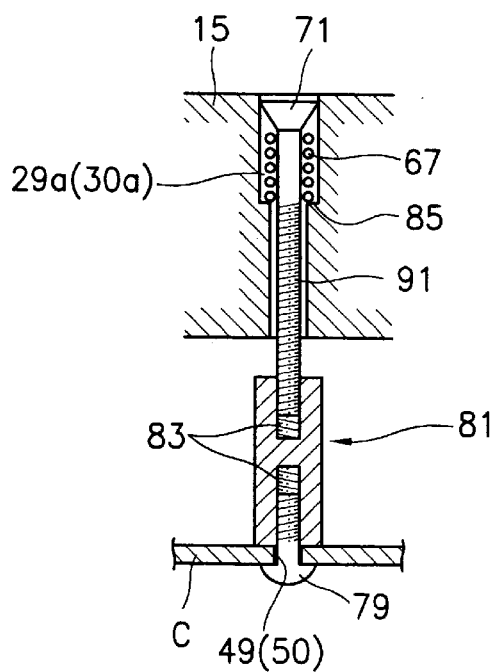
FIG. 8B is a sectional view of another example of the elastic coupler of the heatsink device of FIG. 1, which elastically couples the heatsink device to a PCB.

FIG. 8B is a sectional view of another example of the elastic coupler of the heatsink device of FIG. 1, which elastically couples the heatsink device to a PCB. The structure of this elastic coupler is different from the elastic coupler of FIG. 8A. As long as an elastic force can be applied to the air duct 15 against the PCB "C", the structure of the elastic coupler can be varied.

As shown in FIG. 8B, a support projection 85 is formed on the inner wall of each vertical through hole 29a or 30a formed around the air duct 15. Hold down screws 91 are inserted downward into the vertical through holes 29a and 30a. Each hold down screw 91 passes through the vertical through holes 29a or 30a, protruding out of the air duct 15, as shown in FIG. 8B. The spring 67 is supported against the support projection 85, and the head 71 of the hold down screw 91 is elastically supported by the spring 67.

A coupling member 81 is placed below the air duct 15, facing the hold down screw 91. The coupling member 81 is formed as a cylinder having screw holes 83 at both ends, which are aligned with each other and into which the hold down screw 91 and a support screw 79 will be screwed, respectively. The support screw 79 is a round-headed screw. The opposite end to the round head of the support screw 79 is inserted into the assembly hole 49 or 50 of the PCB "C", from the bottom to the top of the PCB "C", and screwed into one of the screw holes 83 of the coupling member 81. The diameter of a round head of the support screw 79 is larger than the inner diameter of the assembly hole 49 or 50, so that the edge of the assembly hole 49 or 50 can be elastically pushed upward by the head of the support screw 79.

In the elastic coupler having the configuration described above, the elastic support strength of the PCB "C" with respect to the air duct 15 can be controlled by adjusting the degree to which the hold down screw 91 or the support screw 79 is tightened into the coupling member 81.

FIG. 9 is a partially cutaway perspective view illustrating the operation of the heatsink device, and a method of mounting the heatsink device on a PCB. Referring to FIG. 9, the air duct 15 is mounted on top of the PCB "C" and normal thereto, and the auxiliary duct 21 and the fan 13 are mounted atop the air duct 15. As described previously, the auxiliary duct 21 seals the gap between the circumference of the air duct 15 and the fan 13. The air duct 15 is supported by the coupling rod 31 and the hold down screw 25 such that the air duct 15 contacts the PCB "C" and is normal thereto.

In this state, as the fan 13 is operated, air enters into the air duct 15 through the fan 13 to cool the heatsink 35, and flows out of the air duct 15 through the air pathway 19 between the air duct 15 and the PCB "C". As described previously, the lower end of the air duct 15 and the PCB "C" are spaced apart a predetermined distance from each other, so that the air used to cool the heatsink 35 can easily exit the air duct 15 through the air pathway 19.

Since the path of cool air from the fan 13 is isolated from the outside by the air duct 15 and the auxiliary duct 21, the air can be sucked up from the air duct 15 by operating the fan 13 in an opposite direction. In this case, the air enters the air duct 15 through the air pathway 19 to cool the heatsink 35 and exits upward through the fan 13.

Although, in FIG. 9, an elastic coupler is installed in each of the inner vertical through holes 29, the elastic coupler can be installed in the outer vertical through holes 30 to cool an electronic component mounted on a motherboard for Intel's Pentium 4 CPU.

Figure 10:
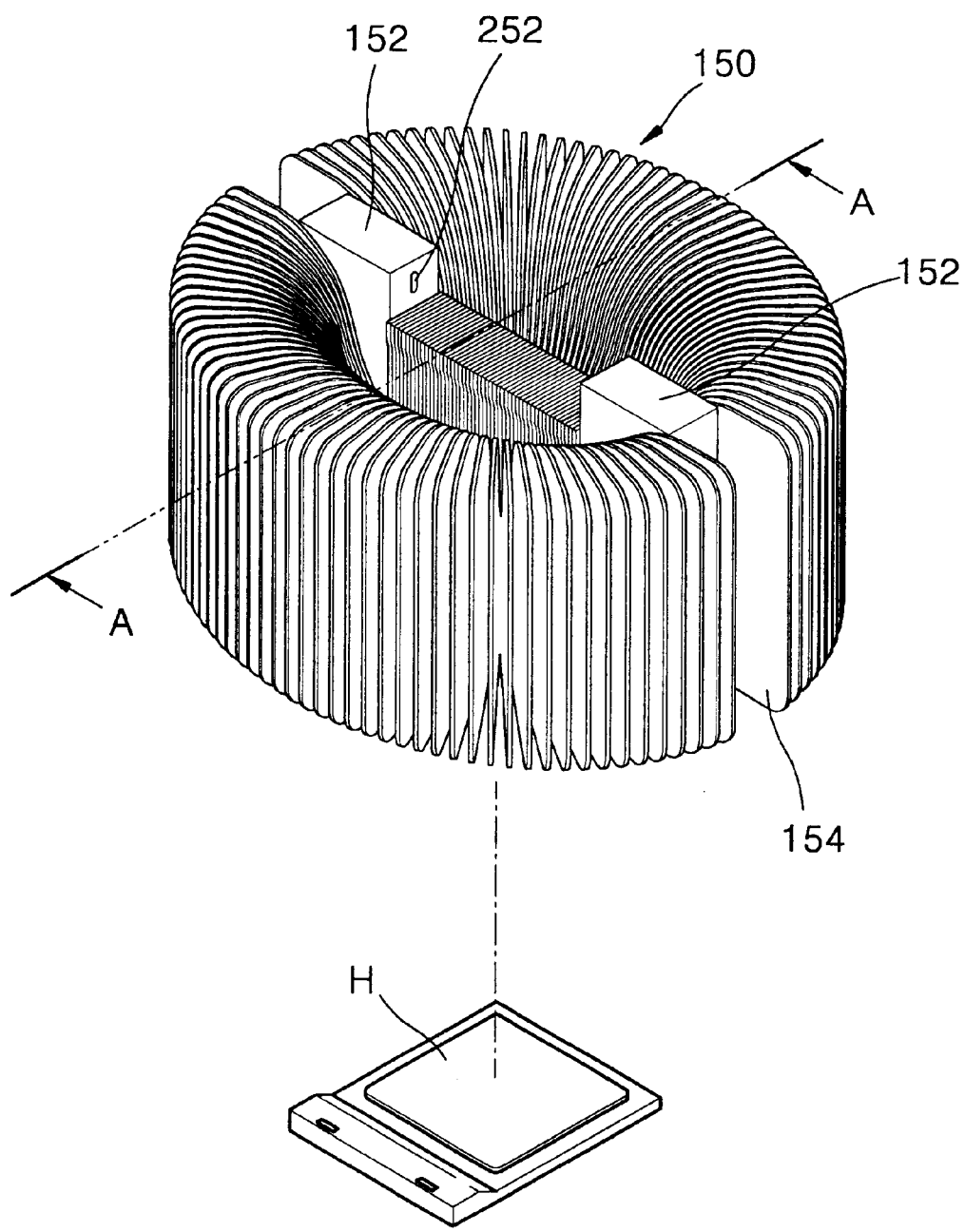
FIG. 10 is a perspective view of an example of a heatsink applicable to a second preferred embodiment of the heatsink device according to the present invention.

FIG. 10 is a perspective view of an example of a heatsink applicable to a second preferred embodiment of the heatsink device according to the present invention. The cylindrical heatsink is characterized by having a recessed center at its upper surface to guide cool air propelled by the fan to the lower end of the heatsink, thereby further enhancing the cooling efficiency.

As is apparent from FIG. 10, in the present embodiment, the heatsink 150 has an elliptical column form with a recession at the center of its upper surface. The recessed center of the upper surface of the heatsink is for guiding an increased amount of cool air from the fan toward the lower center of the heatsink. The bottom of the heatsink 150 is processed to be flat, as illustrated in FIG. 11, to increase the area of contact between the heatsink 150 and the heat-generating source "H".

Figure 12:
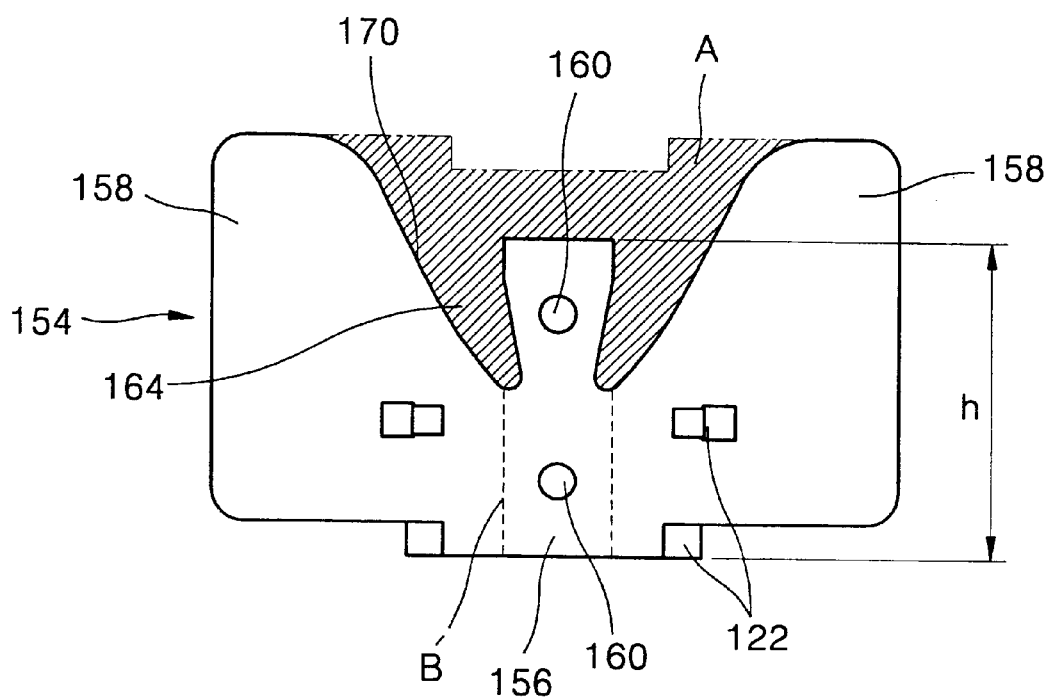
FIG. 12 shows a single heatsink plate of the heatsink of FIG. 10.

The heatsink 150 is formed by tightly joining a number of heatsink plates 154, each having the shape illustrated in FIG. 12, which are stacked upon one another, with a pair of compression blocks 152. A plurality of holes 166 (see FIG. 13) through which screws or rivets pass are formed in each of the compression blocks 152. The principle of assembling the individual heatsink plates 154 using the compression blocks 152 is the same as described in the first embodiment according to the present invention. Reference numeral 252 denotes a slot, which will be described later.

Figure 11:
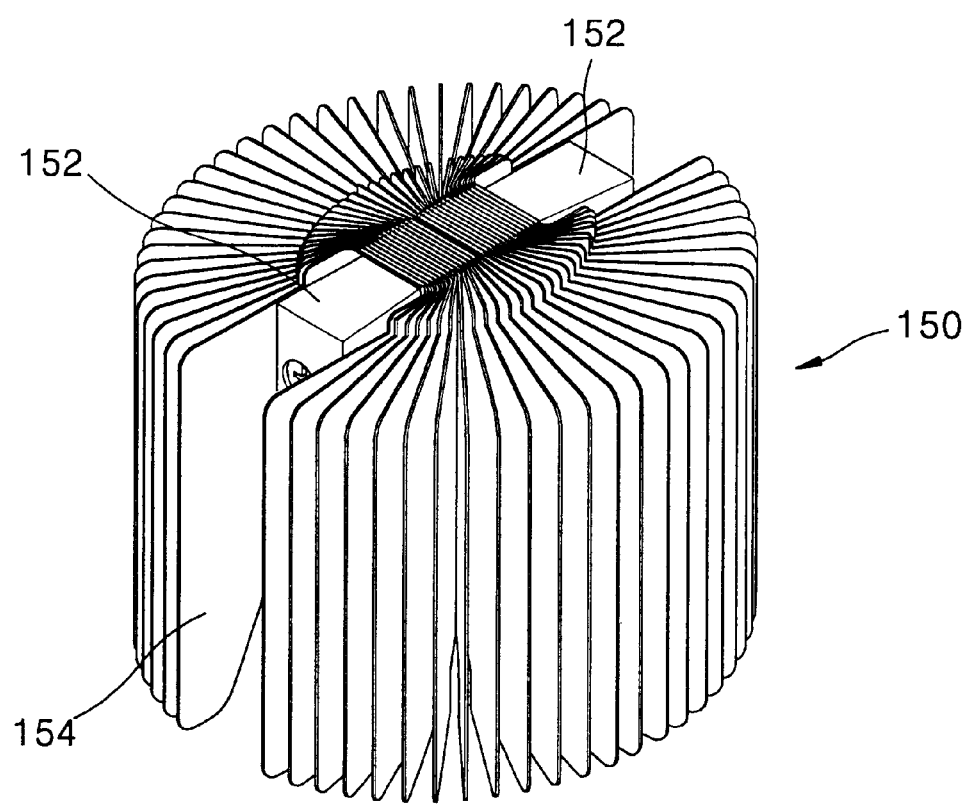
FIG. 11 is an inverted perspective view of the heatsink of FIG. 10.

FIG. 11 is an inverted perspective view of the heatsink 150 of FIG. 10. As shown in FIG. 11, the heatsink 150 has a flat bottom surface to tightly contact a heat-generating source. As is well known, the degree to which a heatsink tightly contacts a heat-generating source directly affects the heat-dissipating efficiency of the heatsink. Accordingly, it is desirable to increase the flatness of the bottom of the heatsink as much as possible. The bottom of the heatsink 150 may be processed by means of additional machining to improve the flatness of the bottom, if required.

FIG. 12 shows a single heatsink plate of the heatsink of FIG. 10. As shown in FIG. 12, each heatsink plate 154 is formed by cutting out an upper portion (the hatched portion "A" in FIG. 12) of a substantially rectangular piece of sheet-metal. The heatsink plate 154 has a heat-absorbing portion 156 at the center and a pair of heat-dissipating portions 158 which symmetrically extend from the heat-absorbing portion 156. The heat-absorbing portion 156 has two holes 160 in a longitudinal direction and contacts a heat-generating source to absorb heat generated therefrom. The heat-dissipating portions 158 externally dissipate heat absorbed by the heat-absorbing portion 156.

The heatsink plate 154 is manufactured by cutting out an upper portion, i.e., the hatched portion "A", from the heatsink plate 18 of the embodiment according to the present invention shown in FIG. 6. Accordingly, the heatsink plate 154 is lighter than the heatsink plate 18 by the weight of the hatched portion "A". An upper contour 170 of the heatsink plate 154 slants from the heat-dissipating portions 158 located on both sides of the heat-absorbing portion 156 toward the center of the heat-absorbing portion 156 and then sharply rises upward on both sidelines of the heat-absorbing portion 156, resulting in a symmetrical streamline form.

Figure 16:
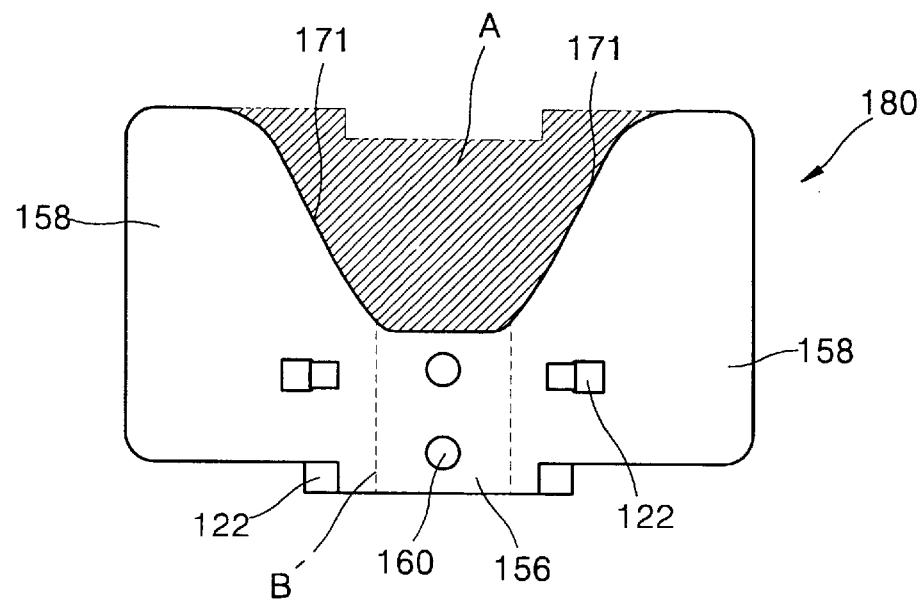
FIG. 16 shows another example of a single heatsink plate of the heatsink applicable to a heatsink device according to the second preferred embodiment of the present invention.

The height "h" of the heat-absorbing portion 156 may be varied. For example, the height "h" of the heat-absorbing portion 156 can be extended to be equal to the height of the heat-dissipating portions 158. Alternatively, the heat-absorbing portion 156 can have no upper extension, as shown in FIG. 16.

By cutting out the upper portion of the heatsink plate 154 as described above, folding lines B' of the heatsink plate 154 become shorter by half or greater, than in the heatsink plate 18 described in the first embodiment of the present invention. Thus, the individual heatsink plates 154 can be tightly joined into the heatsink 150 with a reduced force.

In FIG. 12, reference numeral 122 denotes folded portions. The folded portions 122 are formed to enable the heat-dissipating portions 158 to be radially spread out when the heat-absorbing portions 156 are compressed by the compression blocks 152. The folded portions 122 are formed at both outer sides of and parallel to the folding lines B' by pressing.

In particular, to form the folded portions 122, a predetermined portion of each heatsink plate 154 on each side of the heat-absorbing portion 156 is incised in a bracket pattern, bent back and attached to the plane of the heatsink plate 154. Since the thickness of the heatsink plate 154 at the folded portions 122 is greater than that at the remaining portions and the folded portions 122 are formed along the folding line B', the heat-dissipating portions 158 of the individual heatsink plates 154 are radially spread out by a force exerted on the folded portions 122 as the heat-absorbing portions 156 of the stacked heatsink plates 154 are tightly joined to one another, as shown in FIG. 10.

Figure 13:
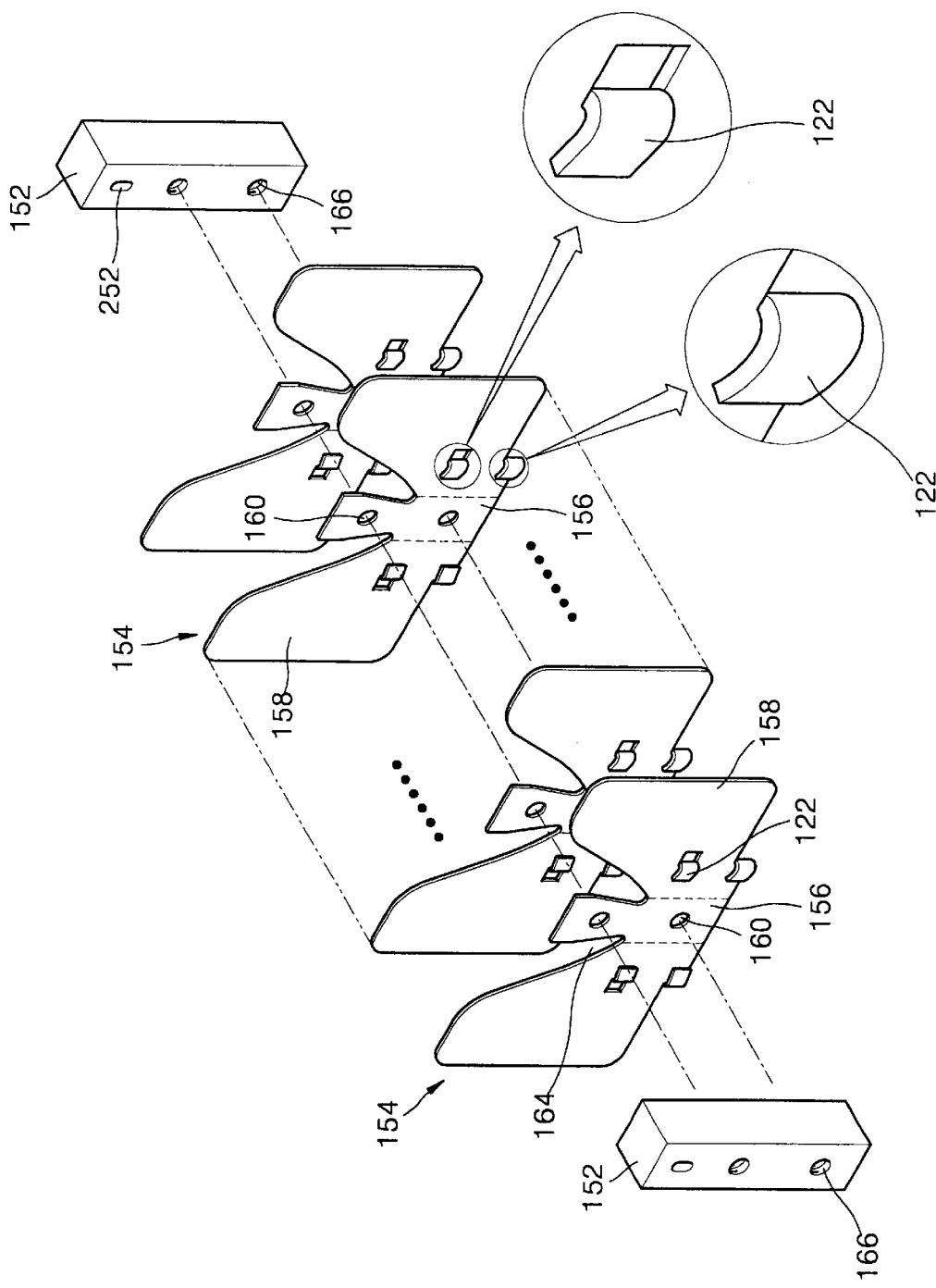
FIG. 13 is an exploded view of the heatsink of FIG. 10, in which a few heatsink plates are shown.

FIG. 13 is a perspective view of the heatsink of FIG. 10, in which a few heatsink plates are shown. As shown in FIG. 13, each heatsink plate 154 is provided with a plurality of folded portions 122. The folded portions 122 are formed to have the same function for the same purpose as the folded portion 57 (see FIG. 3) described in the first embodiment according to the present invention. The folded portions 122 provide a force enabling the heat-dissipating portions 158 of the individual heatsink plates 154 to be radially spread out as the heat-absorbing portions 156 of the stack of the heatsink plates 154 are pushed in opposite directions by the compression blocks 152.

Figure 14:
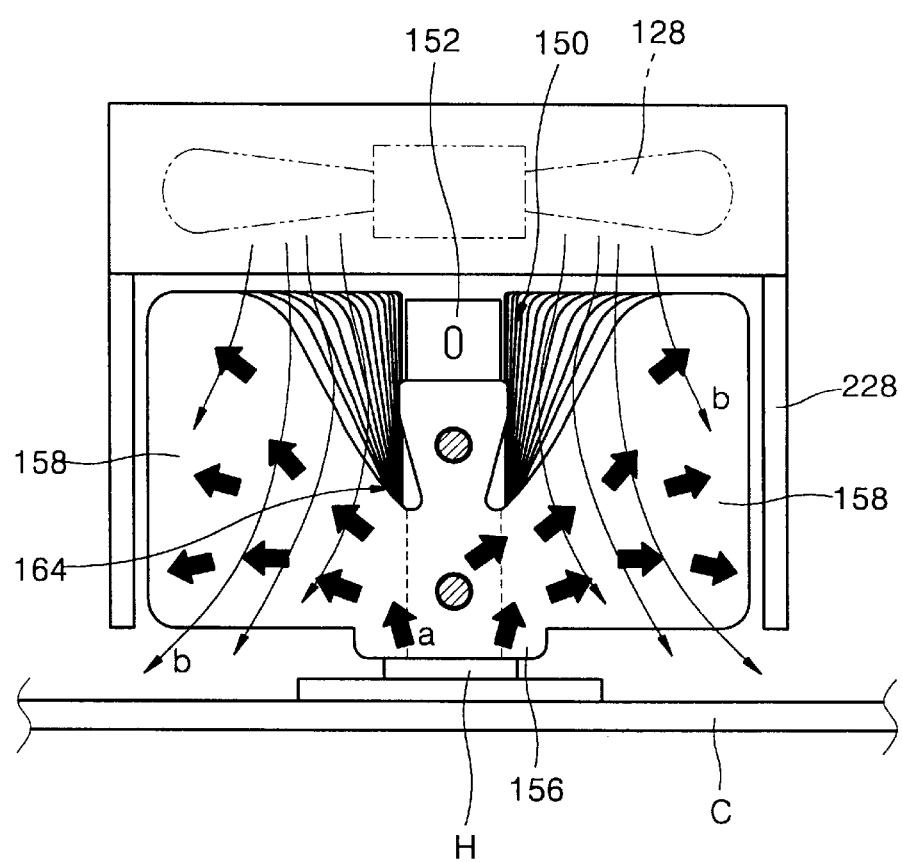
FIG. 14 illustrates the heat dissipating mechanism of the heatsink of FIG. 10.

FIG. 14 is a view of the heatsink from the direction indicated by arrow "A" of FIG. 10 to illustrate the heat dissipating mechanism of the heatsink. Referring to FIG. 14, heat generated from the heat-generating source "H" and absorbed by each heat-absorbing portion 156 of the heatsink 150 is transferred upward and outward, as indicated by arrows "a". When the plurality of heatsink plates 154 are combined together, the cut-out portions of the heatsink plates 154 provide a space 164. The empty space 164 provides a path for cool air propelled by the fan 128 to travel to the heat-generating source "H" without resistance.

Cool air from the fan 128 mostly flows downward, as indicated by arrows "b", through the space 164 and the space formed between each of the heat-dissipating portions 158 which are radially spread out, and reaches the heat-generating source "H". The remaining portion of the cool air flows along the outer circumference of the heatsink 150, hits the inner wall of an air duct 228, and reaches the heat-dissipating portions 158 to cool the same.

Figure 15:
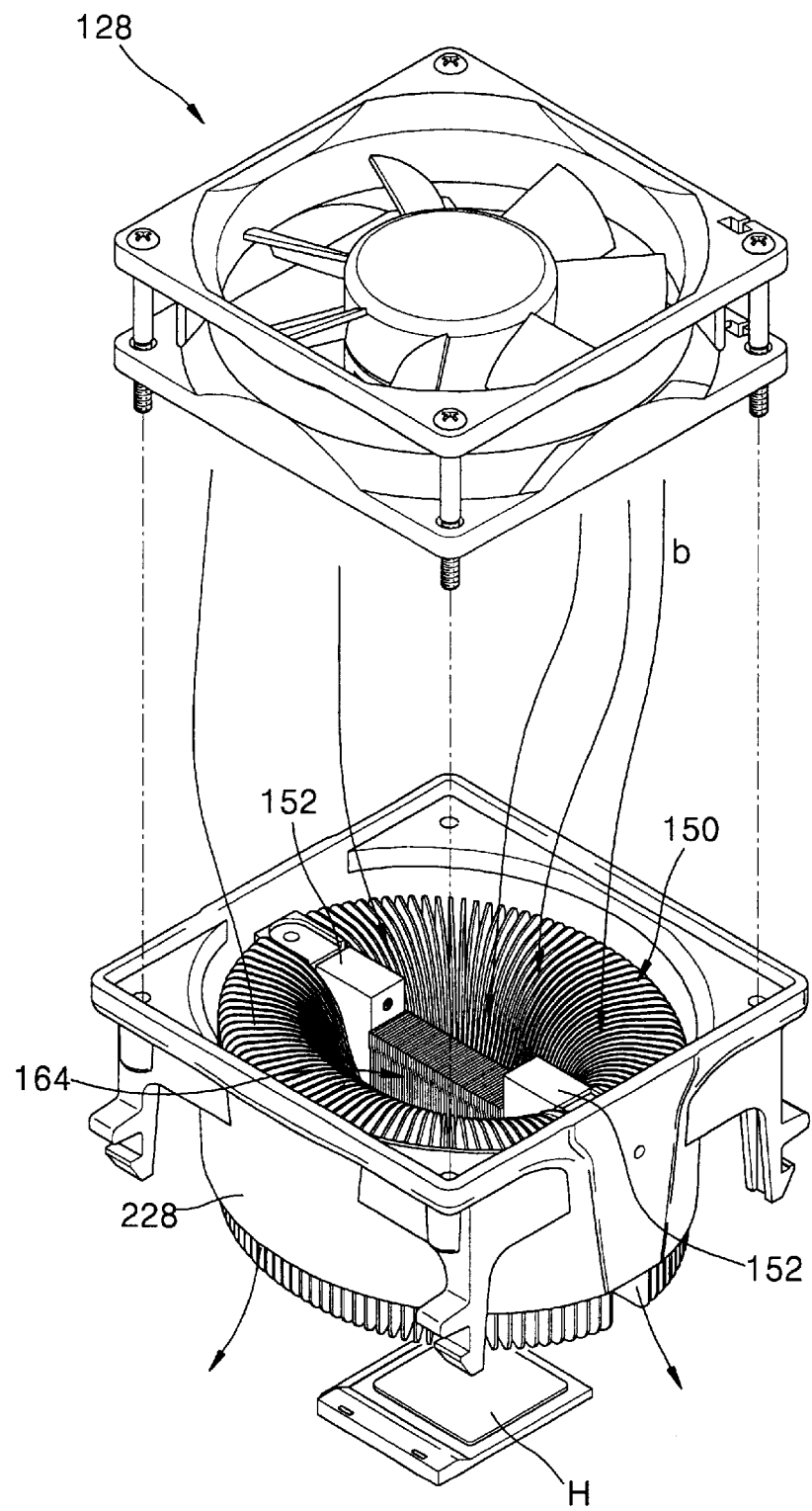
FIG. 15 is an exploded perspective view illustrating an example of the use of the heatsink of FIG. 10.

FIG. 15 is an exploded perspective view illustrating an example of the use of the heatsink of FIG. 10. As shown in FIG. 15, the heatsink 150 is mounted into the air duct 228. The heatsink 150 is enclosed within the air duct 228 and close to its inner circumference. The upper center portion of the heatsink 150 is recessed by the space 164. The air duct 228 constitutes a second embodiment of the heatsink device according to the present invention, which is described later, together with the heatsink 150.

The fan 128 is mounted on the heatsink 150. The fan 128 blows cool air downward over the heatsink 150 while being fixed to the top surface of the air duct 228. In this state, when air propelled by the fan 128 flows downward toward the heatsink 150, as indicated by arrows "b", the air is prevented from surging into the outer circumference of the heatsink 150. This is because the heatsink 150 has an almost uniform distribution of resistance to the flow of air over the entire body. Rather, the air stream downward tends to flow toward the lower center due to the presence of the space 164. This increased flow of the cool air toward the lower center of the heatsink 50 enhances the heat-dissipating efficiency.

FIG. 16 shows another example of a single heatsink plate of a heatsink applicable to the second embodiment of the heatsink device according to the present invention. Elements having the same function as those described above are denoted by the same reference numerals. As shown in FIG. 16, the heatsink plate 180 has no extension from the heat-absorbing portion 156 located in the middle of the heatsink plate 180. An upper contour 171 of the heatsink plate 180 slants from the heat-dissipating portions 158 located on both sides of the heat-absorbing portion 156, and horizontally extends from both sidelines of the heat-absorbing portion to form a top end.

Figure 17:
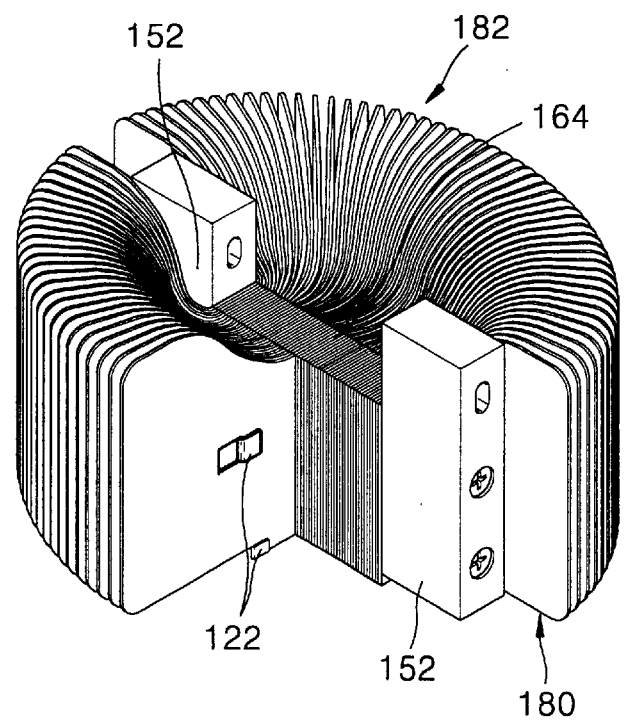
FIG. 17 is a partially cutaway perspective view of a complete heatsink comprising a number of heatsink plates having the structure shown in FIG. 16.

The heatsink plate 180 is formed by cutting out a hatched portion "A" from the heatsink plate 18 (see FIG. 6) described in the first embodiment according to the present invention such that a space 164 (see FIG. 17) can be formed at the upper surface of a heatsink 182 assembled from a number of heatsink plates 180, as shown in FIG. 17.

FIG. 17 is a partially cutaway perspective view of a complete heatsink formed of a number of heatsink plates having the structure of FIG. 16. The heatsink 182 induces the same flow of air as the heatsink 150 of FIG. 15 to increase the heat dissipating efficiency. Referring to FIG. 17, the heatsink 182 has a cylinder-like shape and has a space 164 formed by its recessed upper surface. The space 164 has the same function as the heatsink 150 of FIG. 15.

The heatsink 182 is formed by tightly compressing a number of heatsink plates 180, which are stacked upon one another, with the compression blocks 152 so that the individual heat-dissipating portions 158 are radially spread out.

The heatsink for a heatsink device according to the second embodiment of the present invention has a recessed upper surface so that air propelled by the fan can mostly flow toward the center, rather than the outer sides, of the heatsink to thereby increase the heat dissipating efficiency. Also, each heatsink plate has short folding lines so that a reduced compression force is required to tightly join a number of heatsink plates at the heat-absorbing portions.

It will be appreciated that the shape of the heatsink plate can be varied as long as the heatsink has a recessed upper surface.

Figure 18:
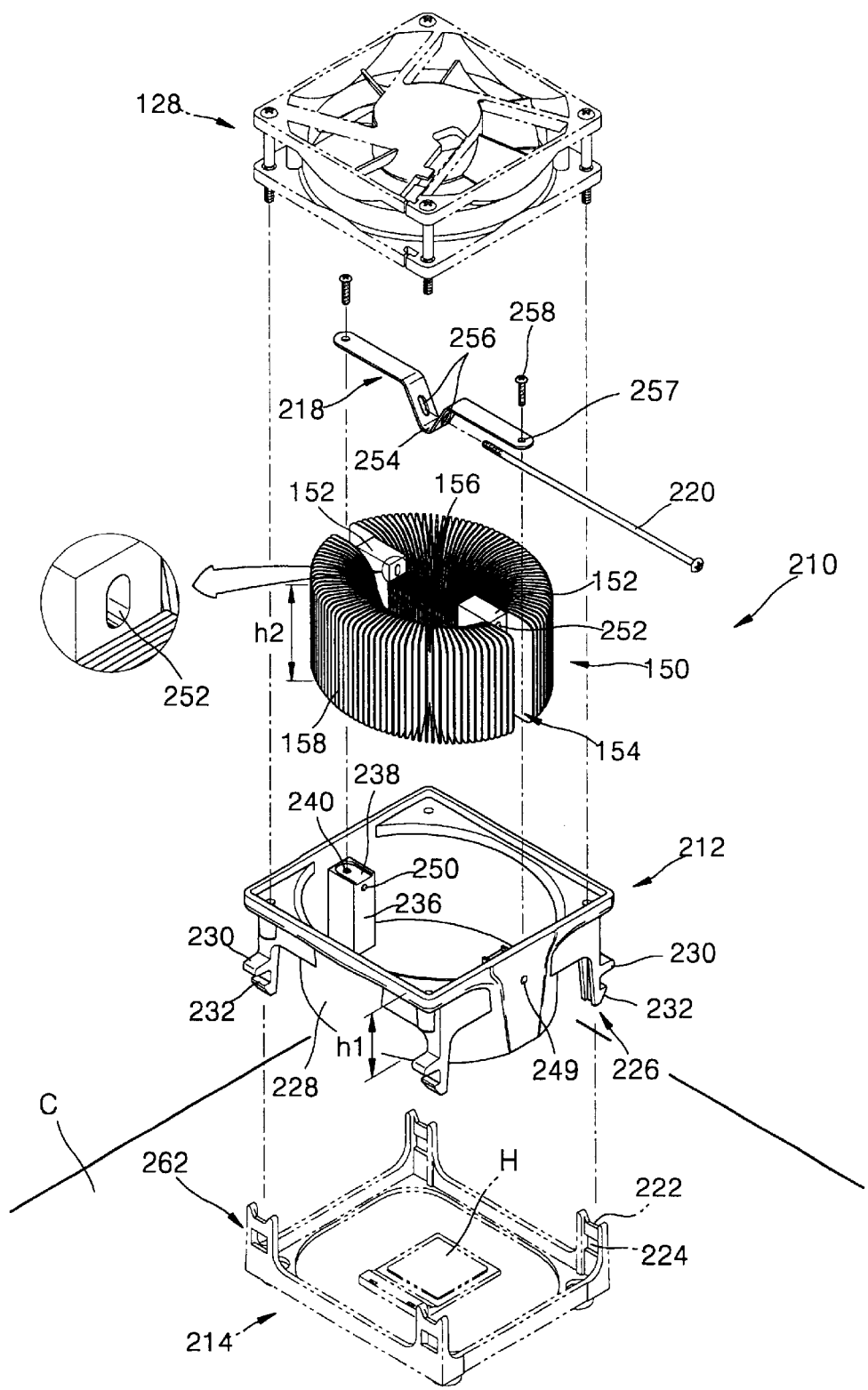
FIG. 18 is an exploded perspective view illustrating the structure of a heatsink device according to the second preferred embodiment of the present invention.

FIG. 18 is an exploded perspective view showing the structure of a heatsink device according to the second embodiment of the present invention. Referring to FIG. 18, the heatsink device 210 includes a mount casing 212 coupled to a socket frame 214, which has been fixed to a PCB "C", the heatsink 150 of FIG. 10 installed in the mount casing 212, and a plate spring 218 which elastically pushes the upper center of the heatsink 150 downward with respect to the mount casing 212. A fan 128 is mounted on the mount casing 212 and blows air down over the heatsink 150.

The socket frame 214 is a known rectangular frame fixed to the PCB "C" to surround a heat-generating source "H" to be cooled. The socket frame 214 has four coupling supports 262 extending upward from its four corners. Each coupling support 262 has a support bar 222 at its upper end, which provides a horizontal support base, and a rectangular coupling hole 224 below the support bar 222.

The mount casing 212 is mounted on the socket frame 214 and has an air duct 228 at the center to accommodate the heatsink 150 therein and four coupling legs 226 at its corners.

Figure 19:
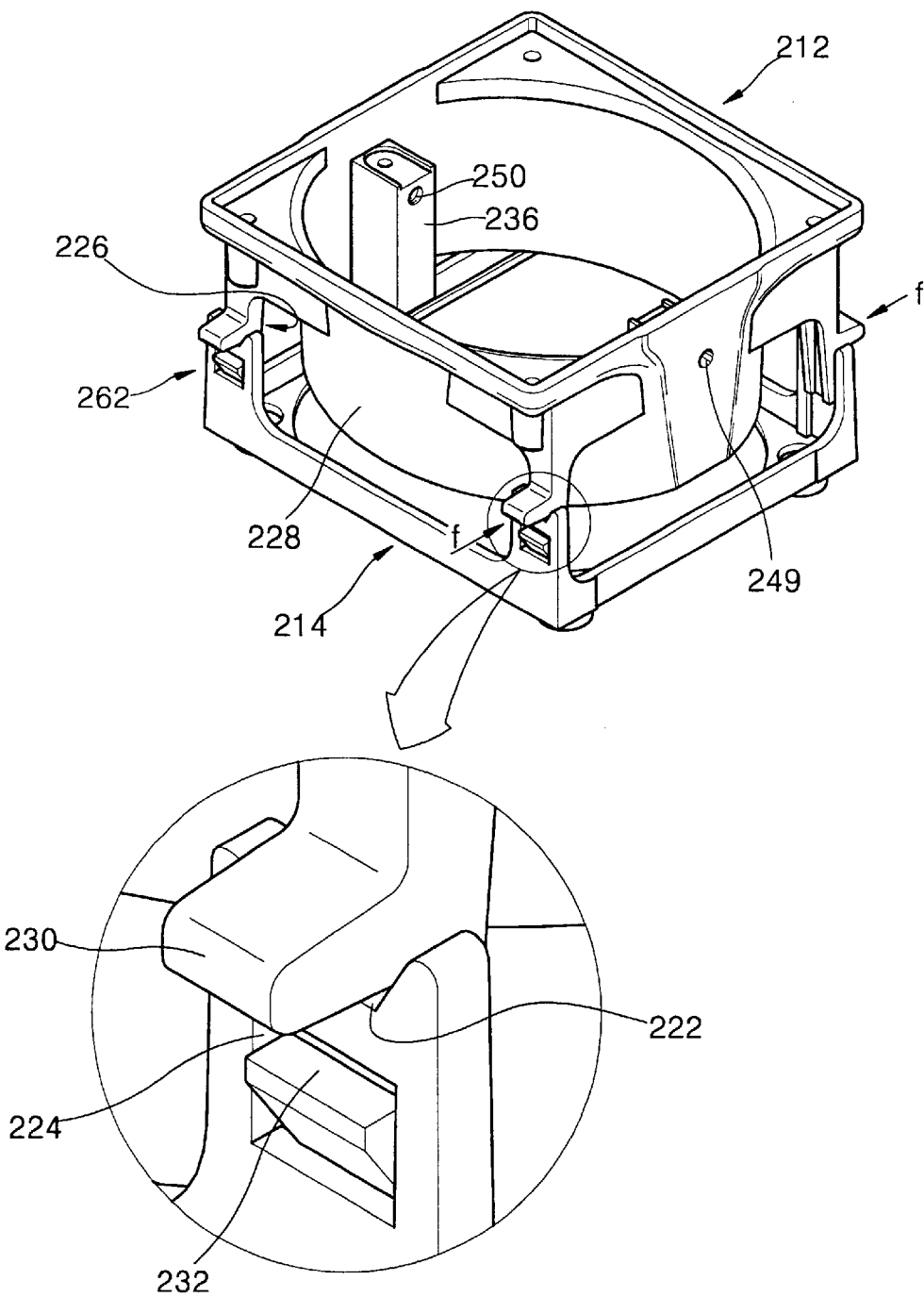
FIG. 19 is a perspective view of the coupling structure of a mount casing to a socket frame in the heatsink device of FIG. 18.

Each coupling leg 226 is coupled to a corresponding coupling support 262 of the socket frame 214 and has a support protrusion 230 and a coupling protrusion 232. As shown in FIG. 19, the support protrusion 230 is supported upward by the support bar 222 of the coupling support 262. The coupling protrusion 232 is a toothed protrusion inserted into the coupling hole 224.

The air duct 228, which accommodates the heatsink 150 therein, is spaced a predetermined distance above the PCB "C" while being coupled to the socket frame 214, as shown in FIG. 19, thereby resulting in an air pathway below its bottom end to discharge air through the same. To this end, the height h1 of the air duct 228 is determined to be smaller than the height h2 of the heatsink 150.

Basically, the inner circumference of the air duct 228 is formed to be conformal with the outer circumference of the heatsink 150 so that almost all the air from the fan 128 can be used for thermal exchange with the heatsink plates 154 before exiting from the air duct 228.

Figure 21:
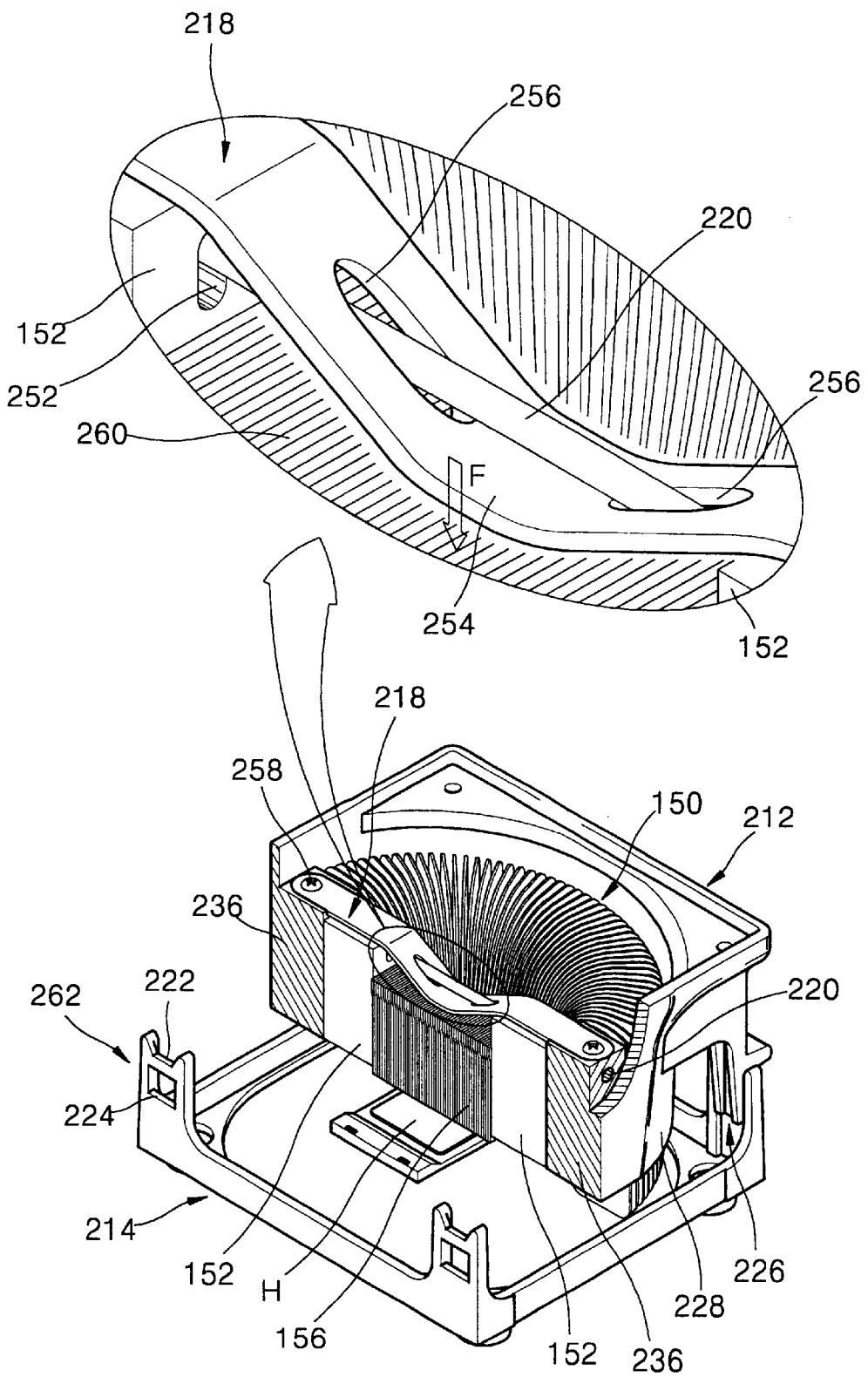
FIG. 21 is a partially cutaway perspective view of the second embodiment of the heatsink device according to the present invention.

The air duct 228 has a pair of heatsink-clamping columns 236 protruding from its inner circumference and facing each other. The heatsink-clamping columns 236 vertically formed on the inner circumference of the air duct 228 have the same size and contact the respective compression blocks 152, as shown in FIG. 21.

One of the heatsink-clamping columns 236 has a hole 249 at its upper portion. The hole 249 laterally extends to the outside through the air duct 228, and a clamping screw 220 described later passes through the hole 249.

The other heatsink-clamping column 236 has a screw hole 250 at its upper portion. The screw hole 250 whose inner wall is threaded is formed aligned with the hole 249. The clamping screw 220 passes through the hole 249 and is screwed into the screw hole 250 across the air duct 228.

A plate spring receptacle 238 is formed in each upper surface of the heatsink-clamping columns 236. The two plate spring receptacles 238 have flat surfaces to receive both ends of the plate spring 218 thereon and vertical screw holes 240. The plate spring 218 will be described later.

The compression blocks 152 bound to both sides of the heatsink 150 correspond to the respective heat-sink clamping-columns 236, as shown in FIG. 21. Each compression block 152 protrudes above the top surface 260 of the stack of the heat-absorbing portions 156. In other words, the top end of the compression block 152 is higher than the top surface 260 of the stack of the heat-absorbing portions 156.

Each compression block 152 has a slot 252 through its upper sides. The slot 252 is slightly long in the vertical direction and is aligned with and communicates with the hole 249 and the screw hole 250 of each heatsink-clamping column 236.

Since the slots 252, the hole 249, and the screw hole 250 are formed aligned with one another, the clamping screw 220 inserted into the hole 249 of one heatsink-clamping column 236 can engage the screw hole 250 of the other heatsink-clamping column 236 through the slot 252 of one compression block 152, across the top surface 260 of the stack of the heat-absorbing portions 156, and then through the slot 252 of the other compression block 152.

The plate spring 218 is mounted on the upper surface of the heatsink 150. The plate spring 218 is a bar-like member having a predetermined width and thickness, and both ends of the plate spring 218 are seated on the plate spring receptacles 238. The plate spring 218 has a middle portion bent downward to elastically push the top surface 260 of the stack of the heat-absorbing portions 156.

The middle portion of the plate spring 218, which is bent downward and V-shaped, forms an elastic compression portion 254. Slots 256 are formed in both sloping sides of the elastic compression portion 254. The slots 256 are formed to be slightly long in the length direction of the plate spring 218 and pass the clamping screw 220.

Both ends of the plate spring 218 have coupling holes 257 and are fixed to the respective plate spring receptacles 238 by screws 258. The screws 258 engage the vertical screw holes 240 through the coupling holes 257 of the plate spring 218.

After fitting the mount casing 212 to the socket frame 214, the heatsink 150 is placed inside the air duct 228 such that the bottom surface of the heatsink 150 contacts a heat-generating source "H". In this state, when the plate spring 218 is connected to the mount casing 212 by the screws 258, the center of the heatsink 150 is elastically pushed downward with respect to the mount casing 212 so that the bottom surface of the heatsink 150 elastically contacts the heat-generating source "H".

In this state, the heatsink 150 is just placed inside the mount casing 212, not coupled to the mount casing 212, while being elastically pushed downward. As a result, when the mount casing 212 is dissembled from the socket frame 214 and lifted up, the heatsink 150 stays on the heat-generating source "H".

The clamping screw 220 connects the heatsink 150 to the mount casing 212. The clamping screw 220 has a threaded end and engages the screw hole 250 formed in one of the heatsink-clamping columns 236 after being inserted into the hole 249 of the other heatsink-clamping column 236, through the slot 252 of one compression block 152, the slots 256 (see FIG. 21) of the plate spring 218, and then the slot 252 of the other compression block 152, as described above.

The clamping screw 220 also acts to maintain the spring plate 218 in place. The clamping screw 220 passes the slots 256 of the plate spring 218 across the air duct 228 to prevent the elastic compression portion 254 from being separated from the top surface 260 of the stack of the heat-absorbing portions 156.

The fan 128 mounted on the plate spring 218 blows cool air toward the heatsink 150 to forcibly cool the same.

FIG. 19 is a perspective view of the coupling structure of the mount casing to the socket plate in the heatsink device of FIG. 18. Referring to FIG. 19, the coupling legs 226 of the mount casing 212 are slidably coupled to the respective coupling supports 262 of the socket frame 214. Each support protrusion 230 is placed on and supported by the corresponding support bar 222, and each coupling protrusion 232 is fitted into the corresponding coupling hole 224.

The support protrusion 230 horizontally protruding outward is supported upward by the support bar 222 so that the mount casing 212 cannot move downward. The coupling protrusion 232 is formed as a triangular tooth and engages the upper side of the coupling hole 224 so that the mounting casing 212 cannot move upward. As a result, the mount casing 212 is securely coupled to the socket frame 214.

To slidably fit the mount casing 212 to the socket frame 214, the mounting casing 212 is placed on the socket frame 214 such that the coupling legs 226 match the corresponding coupling supports 262, and then pushed downward.

To separate the mount casing 212 from the socket frame 214, each support protrusion 230 is pushed inward, as indicated by arrows "f", to liberate the coupling protrusion 232 from the corresponding coupling hole 224, and then the body of the mount casing 212 is lifted up.

Figure 20:
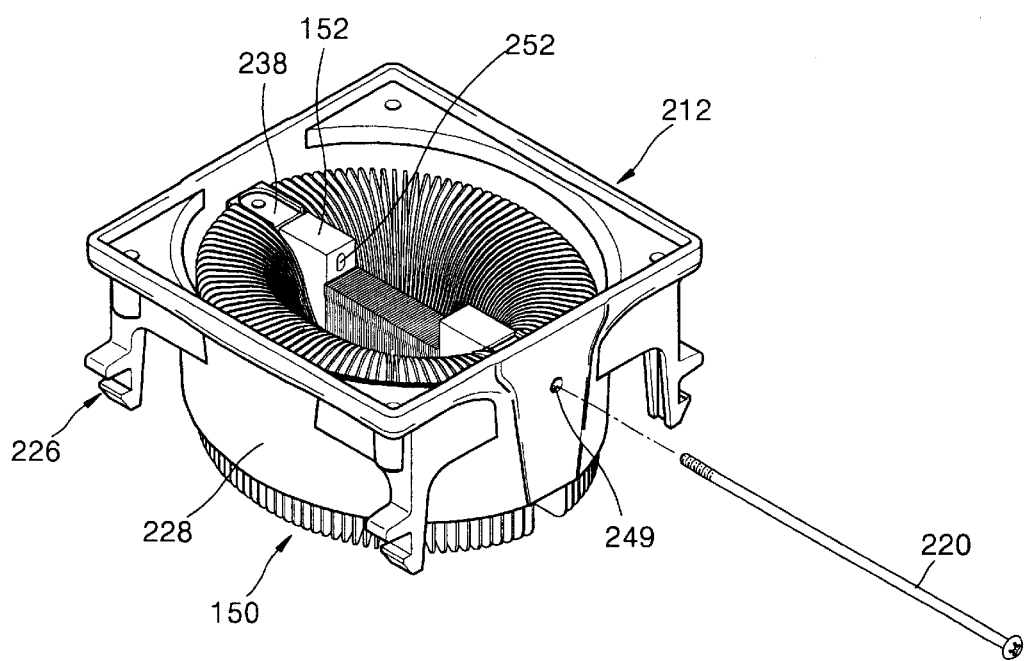
FIG. 20 is a perspective view illustrating the heatsink being coupled to the mount casing to assemble the heatsink device of FIG. 18.

FIG. 20 is a perspective view illustrating the heatsink being installed into the mount casing to assemble the heatsink device of FIG. 18. As shown in FIG. 20, the clamping screw 220 has a threaded end and is long enough to cross the air duct 228, as described above.

To fix the heatsink 150 to the mount casing 212, the heatsink 150 is initially placed inside the air duct 228 such that the slots 252 of the compression blocks 152 are aligned with the hole 249 and the screw hole 250 of the heatsink-clamping columns 236.

After alignment of the slots 252 and the hole 249 and screw hole 250 is complete, the threaded end of the clamping screw 220 is inserted into the hole 249 in a lateral direction, passes through the slots 252, and engages the screw hole 250. If the mount casing 212 is lifted up in this state, the heatsink 150 may be lifted up together with the mount casing 212.

FIG. 21 is a partially cutaway perspective view of the heatsink device according to the second embodiment of the present invention. Referring to FIG. 21, the mount casing 212 is mounted on the socket frame 214. The heatsink 150 is placed inside the air duct 228 of the mount casing 212. The heatsink 150 is fixed to the mount casing 212 by the clamping screw 220 while its bottom surface contacts a heat-generating source "H" to externally dissipate heat generated from the same.

The plate spring 218 is supported by the top ends of the compression blocks 152 and heatsink-clamping columns 236, and both ends of the plate spring 218 are fixed to the heatsink-clamping columns 236 by the screws 258.

The bottom end of the elastic compression portion 254 formed in the middle of the plate spring 218 elastically pushes the top surface 260 of the stack of the heat-absorbing portions 156 in the direction indicated by arrow "F" to allow the bottom surface of the stack of the heat-absorbing portions 156 to elastically contact the heat-generating source "H". At this time, the heatsink 150 moves downward with respect to the mount casing 212 by the elastic force exerted in the direction "F" so that the clamping screw 220 contacts the upper portion of the slots 252, which are slightly long in the vertical direction.

The slots 256 formed in both sloping sides of the elastic compression portion 254, extending in the direction of the plate spring 218, allow the clamping screw 220 to horizontally move upward and downward without interference when the heatsink 150 moves upward and downward with respect to the mount casing 212.

The heatsink 150 is movable downward with respect to the mount casing coupled to the socket frame 214, and the center of the heatsink 150 is elastically pushed downward by the plate spring 218. As a result, the heatsink 150 is kept in tight contact with the heat-generating source "H". As an example, even after an external impact on the mount casing 212 in the upper direction, the heatsink 150 remains in contact with the heat-generating source "H".

Figure 22:
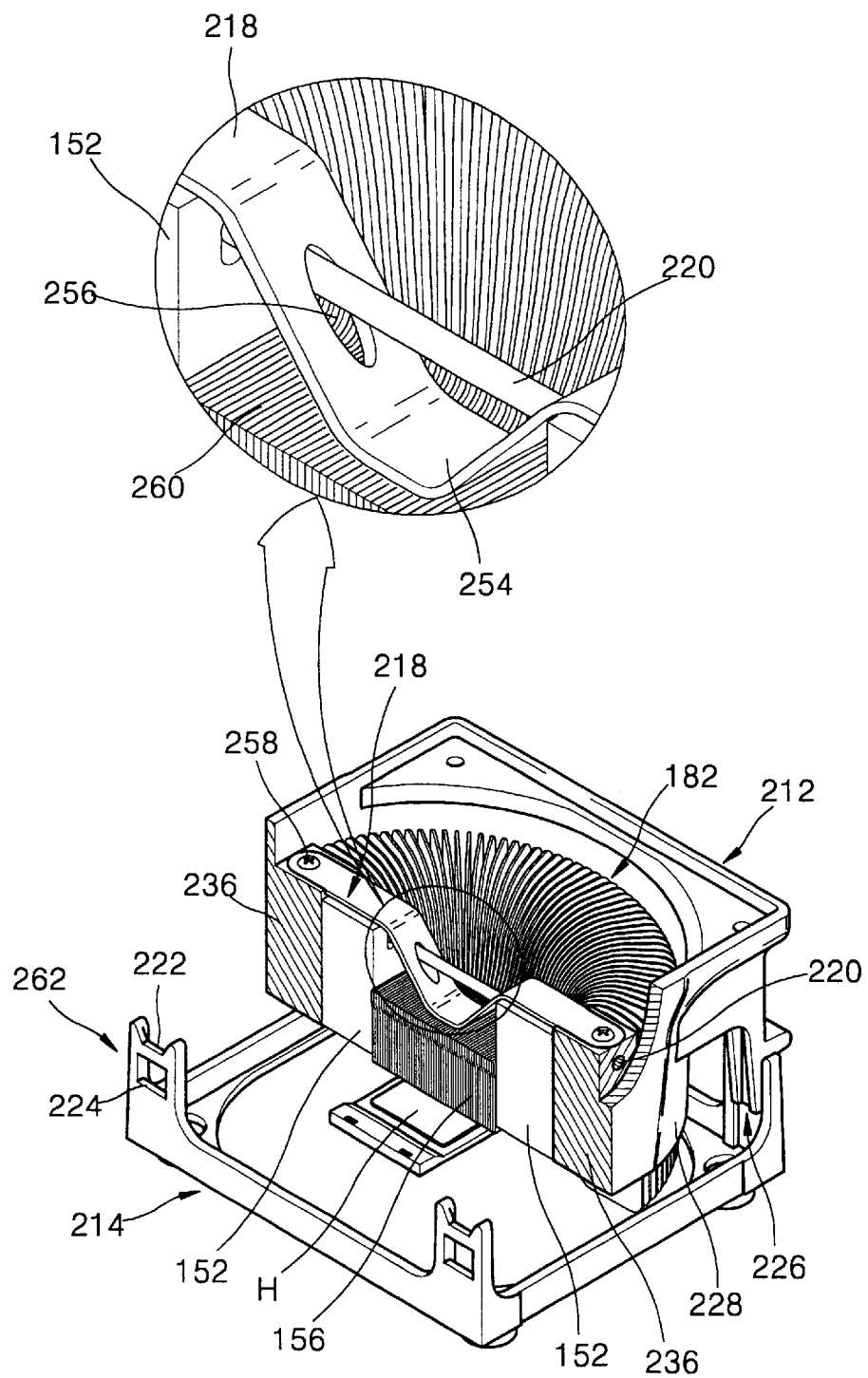
FIG. 22 is a partially cutaway perspective view of another heatsink device according to the second embodiment of the present invention to which the heatsink of FIG. 17 is applied.

FIG. 22 is a partially cutaway perspective view of another heatsink device according to the second embodiment of the present invention to which the heatsink of FIG. 17 is applied. Elements having the same function as in FIG. 21 are denoted by the same reference numerals. As shown in FIG. 22, the mount casing 212 is mounted on the socket frame 214, and the heatsink 182 is placed inside the air duct 228 of the mount casing 212. The bottom surface of the heatsink 182 is in contact with the heat-generating source "H" to dissipate heat generated from the heat-generating source "H", and the heatsink 182 is fixed to the mount casing 212 by the clamping screw 220. The principle of mounting the heatsink 182 into the mount casing 212 such that the heatsink 182 elastically contacts the heat-generating source "H" is the same as described with reference to FIG. 21.

As described above, the heatsink according to the present invention is formed of a plurality of sheet-shaped heatsink plates, and the individual heatsink plates are bound to one another to be radially spread out, thereby enlarging the surface area of the heatsink and increasing its heat-dissipating efficiency. In the heatsink device according to the present invention, the heatsink is installed in the air duct, and cool air is supplied into the air duct by the fan, to thereby further increase the heat-dissipating efficiency. The binding force of the heatsink to a heat-generating source can be elastically maintained, which allows the heatsink to remain bound to the heat-generating source even after an external impact.

In addition, by cutting out an upper portion of the heatsink plate, folding lines of the heatsink plate are shortened so that the heat-absorbing portions of a plurality of heatsink plates can be tightly joined to form a heatsink by a reduced force. The resulting heatsink has a recession at the center of its upper surface. This structure allows cool air propelled by the fan to reach the bottom center of the heatsink, thereby further enhancing the heat-dissipating efficiency. Also, vibration and noise caused while cool air flows over the heat-dissipating portions of the heatsink are reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A heatsink device comprising:
a heatsink including a plurality of sheet-shaped heatsink plates each having a heat-absorbing portion in contact with an upper surface of a heat-generating source and normal thereto to absorb heat from the heat-generating source, and a heat-dissipating portion extending from the heat-absorbing portion to dissipate the absorbed heat into the air, wherein the plurality of heatsink plates are arranged in a stack,
and wherein at least one folded portion having a predetermined thickness is formed at the heat-dissipating portions, so when the heat-absorbing portions of the individual heatsink plates are tightly joined to one another by compression blocks, the heat-absorbing portions form the center of the heatsink and the heat-dissipating portions of the individual heatsink plates are radially spread out by a force exerted upon the folded portion from the center to give the heatsink an elliptical column form;
an air duct in which the heatsink is installed to guide cool air over the heatsink; and
a fan installed on the air duct for forcibly cooling the heatsink by blowing air into the air duct.

2. The heatsink device of claim 1, wherein the air duct further comprises a coupling leg detachably coupled to each corresponding coupling support of a socket frame which surrounds the heat-generating source mounted on a printed circuit board and coupling supports protruding from the circumference of the socket frame, to thereby form a mount casing; and
an elastic compression member which elastically pushes the heatsink toward the heat-generating source while being supported by the mount casing.

3. The heatsink device of claim 2, wherein the elastic compression member is a plate spring extending across the air duct while its ends are fixed to the mount casing and having an elastic compression portion in its middle portion for applying an elastic downward force to the upper center of the heatsink.

4. The heatsink device of claim 3, wherein the elastic compression portion of the plate spring contacts and elastically pushes the upper center of the heatsink downward.

5. The heatsink device of claim 4, wherein the upper portion of each of the heatsink plates is cut out into a predetermined shape such that the upper contour of each heatsink plate after being cut out slants downward from the heat-dissipating portion toward the heat-absorbing portion forming a streamline and rises upward at both sides of the heat-absorbing portion.

6. The heatsink device of claim 5, wherein the compression blocks compress the heat-absorbing portions stacked upon one another in opposite directions to join the same and each compression block has an upper end protruding above the top surface of the stack of the heat-absorbing portions, and the air duct has a pair of heatsink-clamping columns protruding from its inner wall and facing each other, each of the heatsink-clamping columns corresponding to a respective compression block and having a top end higher than or equal to the compression block.

7. The heatsink device of claim 6, wherein the plate spring has a predetermined width and thickness, both ends of the plate spring are fixed to the upper end of the heatsink-clamping columns, the elastic compression portion is formed by bending a middle portion of the plate spring downward such that the middle portion can push the upper center of the heatsink downward.

8. The heatsink device of claim 7, wherein the compression blocks have slots and the heatsink-clamping columns have holes, the slots and holes being horizontally aligned with one another, the elastic compression portion of the plate spring has slots extending in the length direction of the plate spring, and a clamping screw is inserted into the hole of one of the heatsink-clamping columns, the slot of the corresponding compression block, the slots of the elastic compression portion passing over the upper surface of the heat-absorbing portions joined to one another, the slot of the other compression block, and then the hole of the other heatsink-clamping column, to elastically support the heatsink with respect to the mount casing.

9. The heatsink device of claim 4, wherein the upper portion of each of the heatsink plates is cut out into a predetermined shape such that the upper contour of each heatsink plate after being cut out slants downward from the heat-dissipating portion toward the heat-absorbing portion forming a streamline and horizontally extends from both sidelines of the heat-absorbing portion to form a top end.

10. The heatsink device of claim 9, wherein the compression blocks compress the heat-absorbing portions stacked upon one another in opposite directions to join the same and each compression block has an upper end protruding above the top surface of the stack of the heat-absorbing portions, and the air duct has a pair of heatsink-clamping columns protruding from its inner wall and facing each other, each of the heatsink-clamping columns corresponding to a respective compression block and having a top end higher than or equal to the compression block.

11. The heatsink device of claim 10, wherein the plate spring has a predetermined width and thickness, both ends of the plate spring are fixed to the upper end of the heatsink-clamping columns, the elastic compression portion is formed by bending a middle portion of the plate spring downward such that the middle portion can push the upper center of the heatsink downward.

12. The heatsink device of claim 11, wherein the compression blocks have slots and the heatsink-clamping columns have holes, the slots and holes being horizontally aligned with one another, the elastic compression portion of the plate spring has slots extending in the length direction of the plate spring, and a clamping screw is inserted into the hole of one of the heatsink-clamping columns, the slot of the corresponding compression block, the slots of the elastic compression portion passing over the upper surface of the heat-absorbing portions joined to one another, the slot of the other compression block, and then the hole of the other heatsink-clamping column, to elastically support the heatsink with respect to the mount casing.

\* \* \* \* \*